(12) United States Patent
Sazegari et al.

(10) Patent No.: US 10,331,558 B2
(45) Date of Patent: Jun. 25, 2019

(54) SYSTEMS AND METHODS FOR PERFORMING MEMORY COMPRESSION

(71) Applicant: Apple Inc., Cupertino, CA (US)

(72) Inventors: Ali Sazegari, Los Altos, CA (US); Charles E. Tucker, Campbell, CA (US); Jeffry E. Gonion, Campbell, CA (US); Gerard R. Williams, III, Los Altos, CA (US); Chris Cheng-Chieh Lee, San Jose, CA (US)

(73) Assignee: Apple Inc., Cupertino, CA (US)

( * ) Notice: Subject to any disclaimer, the term of this patent is extended or adjusted under 35 U.S.C. 154(b) by 27 days.

(21) Appl. No.: 15/663,115

(22) Filed: Jul. 28, 2017

(65) Prior Publication Data

US 2019/0034333 A1    Jan. 31, 2019

(51) Int. Cl.
| | | |
|---|---|---|
| H03M 7/34 | (2006.01) | |
| H03M 7/38 | (2006.01) | |
| G06F 12/08 | (2016.01) | |
| H03M 7/30 | (2006.01) | |
| G06F 12/00 | (2006.01) | |
| G06F 13/00 | (2006.01) | |

(52) U.S. Cl.
CPC ............ G06F 12/08 (2013.01); H03M 7/30 (2013.01); *G06F 12/00* (2013.01); *G06F 13/00* (2013.01); *G06F 2212/401* (2013.01)

(58) Field of Classification Search
CPC .... G06F 12/08; G06F 12/00; G06F 2212/401; G06F 13/00; H03M 7/30; H03M 7/00; H03M 5/00
USPC ...................................... 341/50, 51, 67, 107
See application file for complete search history.

(56) References Cited

U.S. PATENT DOCUMENTS

| | | | | |
|---|---|---|---|---|
| 6,026,198 A | * | 2/2000 | Okada | G06T 9/005 341/107 |
| 6,215,906 B1 | * | 4/2001 | Okada | G06T 9/005 382/239 |
| 6,879,266 B1 | * | 4/2005 | Dye | G06F 12/08 341/51 |
| 7,447,814 B1 | | 11/2008 | Ekman | |

(Continued)

FOREIGN PATENT DOCUMENTS

JP     H1084484 A     3/1998

OTHER PUBLICATIONS

Extended European Search Report in European Application No. 18185386.2, dated Dec. 7, 2018, 9 pages.

*Primary Examiner* — Jean B Jeanglaude
(74) *Attorney, Agent, or Firm* — Meyertons Hood Kivlin Kowert and Goetzel PC; Rory D. Rankin

(57) ABSTRACT

Systems, apparatuses, and methods for efficiently moving data for storage and processing. A compression unit within a processor includes multiple hardware lanes, selects two or more input words to compress, and for assigns them to two or more of the multiple hardware lanes. As each assigned input word is processed, each word is compared to an entry of a plurality of entries of a table. If it is determined that each of the assigned input words indexes the same entry of the table, the hardware lane with the oldest input word generates a single read request for the table entry and the hardware lane with the youngest input word generates a single write request for updating the table entry upon completing compression. Each hardware lane generates a compressed packet based on its assigned input word.

20 Claims, 14 Drawing Sheets

(56) References Cited

U.S. PATENT DOCUMENTS

| | | | |
|---|---|---|---|
| 8,615,541 B2 * | 12/2013 | Johnson | G06F 7/38 |
| | | | 708/495 |
| 8,847,798 B2 * | 9/2014 | Pell | H03M 5/145 |
| | | | 341/67 |
| 2014/0189281 A1 | 7/2014 | Sokol, Jr. | |
| 2016/0283159 A1 | 9/2016 | Gopal et al. | |

* cited by examiner

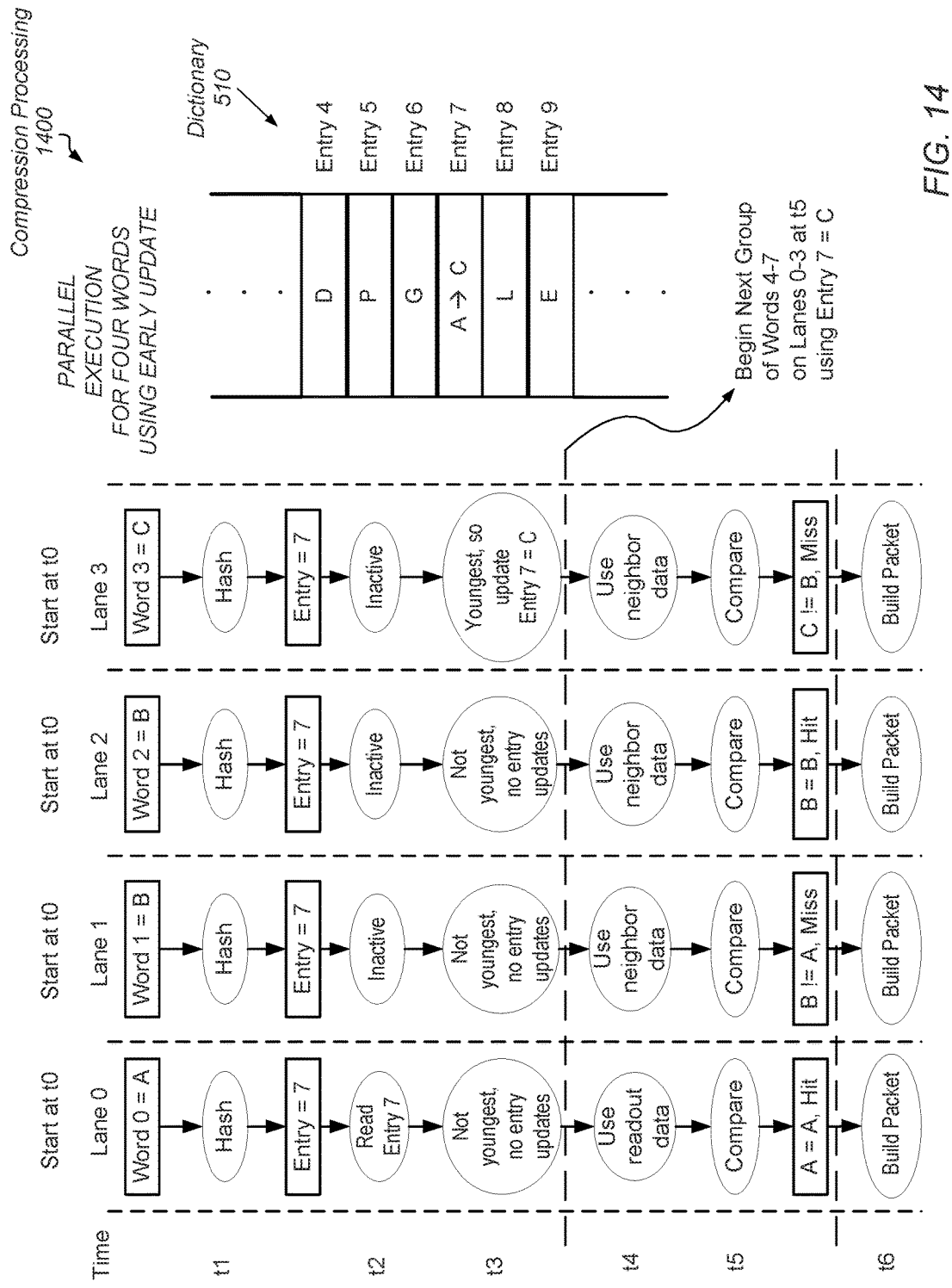

SYSTEMS AND METHODS FOR PERFORMING MEMORY COMPRESSION

BACKGROUND

Technical Field

Embodiments described herein relate to the field of computing systems and, more particularly, to efficiently moving data for storage and processing.

Description of the Related Art

Generally speaking, a variety of computing systems include a processor and a memory, and the processor generates access requests for instructions and application data while processing one or more software applications. When fetching instructions and data, the processor checks a hierarchy of local cache memories and, if not found, the processor issues requests for the desired instructions and data to main memory or other storage such as, a CD-ROM, or a hard drive, for example.

At times, the number of software applications simultaneously running on the computing system reaches an appreciable number. In addition, a variety of computing systems include multiple processors such as a central processing unit (CPU), data parallel processors like graphics processing units (GPUs), digital signal processors (DSPs), and so forth. Therefore, the amount of instructions and data being used for processing the multiple software applications appreciably grows. However, the memory storage locations in the local cache memories have a limited amount of storage space. Therefore, swapping of the instructions and data between the local cache memories and the persistent storage occurs.

The swapping and corresponding latency for waiting for requested information to be loaded reduces performance for the computing system. To reduce an amount of storage for a particular quantity of data, the data is compressed. Such compression takes advantage of repeated sequences of individual data bits included in the data. When the data is to be accessed, the data is decompressed, and then possibly recompressed once the access has been completed.

Generally speaking, when a general-purpose processor, such as a central processing unit (CPU), is performing a software routine to compress and/or decompress data, it is occupied for the duration of the operations. Additionally, in a system that includes multiple processors, many times, the CPU is the only processor with support for retrieving, compressing and decompressing the desired data. Therefore, the CPU is partially or fully unavailable while performing one or more of local and network data retrieval and compression. Further, the other processors incur delays while waiting for the CPU to finish the retrieving, compressing and decompressing operations on their behalf.

In view of the above, methods and mechanisms for efficiently moving data for storage and processing are desired.

SUMMARY

Systems and methods for efficiently moving data for storage and processing are contemplated. In various embodiments, a computing system includes a memory, a cache memory and a processor. In response to receiving a compression instruction, the processor fetches data from the memory into the cache memory. In some embodiments, the data is partitioned into multiple input words. Following, the processor loads multiple input words from the cache memory into a read buffer within the processor. A compression unit within the processor includes circuitry for executing the compression instruction. Therefore, the processor is available for processing other operations while the compression unit processes the compression instruction.

In an embodiment, the compression unit selects two or more input words of the multiple words to be used as assigned input words. The compression unit includes multiple hardware lanes for performing operations of a compression algorithm. Each of the two or more hardware lanes of the multiple hardware lanes are assigned to a respective one of the selected two or more input words. Each of the two or more hardware lanes generates a respective compressed packet based on at least its assigned input word. To generate a compressed packet, each hardware lane uses a value to compare against the assigned word to determine intra-group dependencies. However, in various embodiments, prior to determining intra-group dependencies of a first group of words with a same index, a dictionary is accessed for a younger second group of words, each word in the second group having a same index.

The compression unit combines the compressed packets into a group of compressed packets. In some embodiments, the compression unit further combines two or more groups into a packed group and writes the packed group into a write buffer. At a later time, the processor sends the packed group from the write buffer to a target storage location.

In various embodiments, as each assigned input word is processed, it is searched for repeated sequences of data bits by being compared against previously seen data. In some embodiments, the previously seen data is stored in entries of a data structure (e.g., such as a table) referred to as a dictionary. In some embodiments, the multiple hardware lanes perform steps of a combination of a statistical-based compression algorithm and a dictionary-based compression algorithm. In some embodiments, each of the two or more selected input words, which are assigned to the two or more hardware lanes, has a corresponding index pointing to a same entry of the multiple entries of the table. In some embodiments, the contents of the same entry of the table are read from the dictionary once for processing of the input words currently assigned to the two or more hardware lanes. In an embodiment, the hardware lane with the oldest input word of the two or more assigned input words generates the single read request. Additionally, the hardware lane with the youngest input word of the two or more assigned input words generates the single write request for updating the table upon completion of the compression of the two or more assigned input words. Therefore, the multiple read and write requests for the sequences stored in the table for a serial implementation are reduced to a single read request and a single write request for the parallel implementation using the multiple hardware lanes.

In a further embodiment, the processor further includes a decompression unit utilizing multiple hardware lanes. In response to receiving a decompression instruction, the processor fetches compressed packets and the decompression unit within the processor includes circuitry for executing the decompression instruction. Therefore, the processor is available for processing other operations while the decompression unit processes the decompression instruction. Each of the multiple hardware lanes of the decompression unit generates a word based on the compressed packet.

These and other embodiments will be further appreciated upon reference to the following description and drawings.

BRIEF DESCRIPTION OF THE DRAWINGS

The above and further advantages of the methods and mechanisms may be better understood by referring to the following description in conjunction with the accompanying drawings, in which:

FIG. 14 is a block diagram of another embodiment of compression processing.

Figure 1:
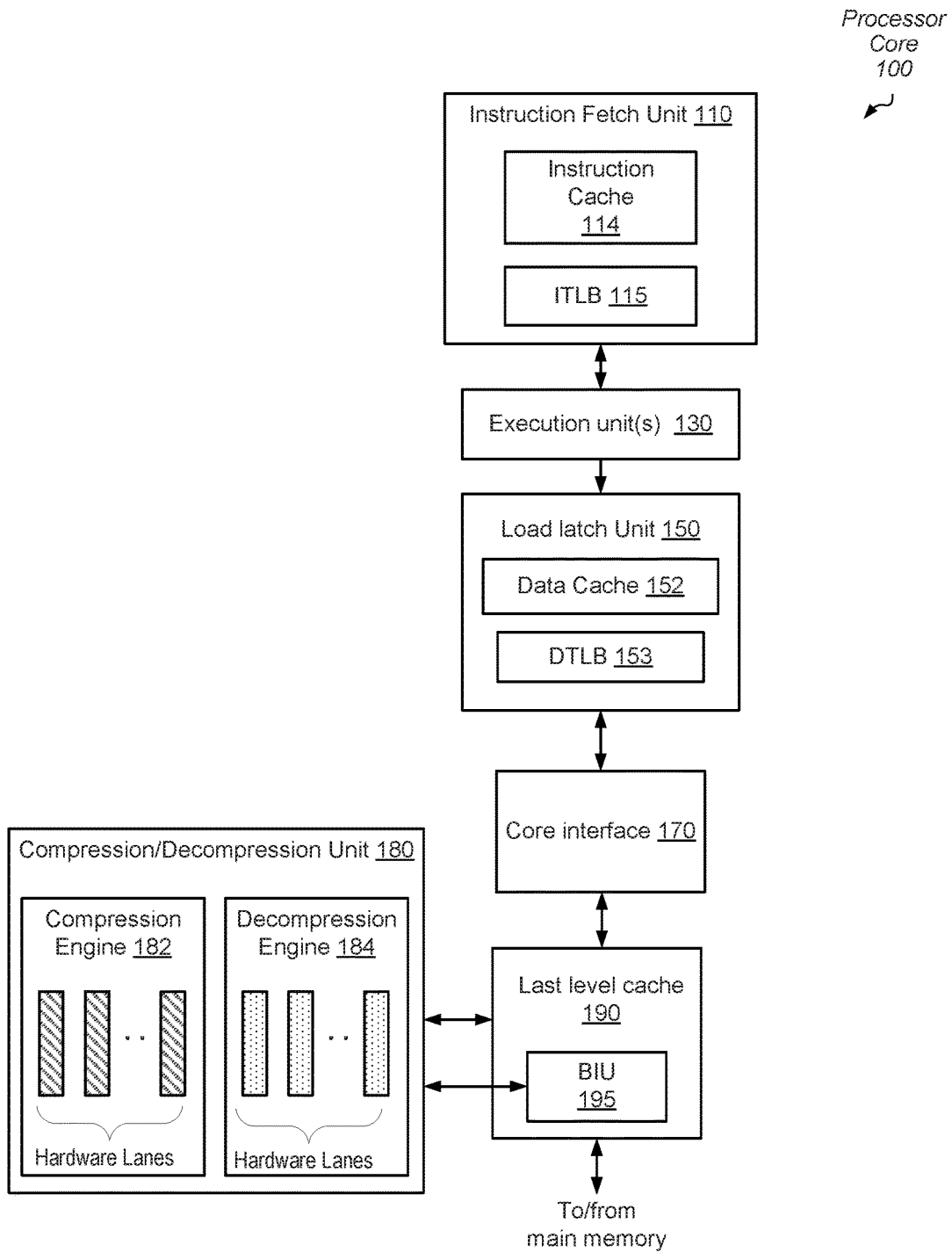
FIG. 1 is a block diagram of one embodiment of a processor core.

While the embodiments described in this disclosure may be susceptible to various modifications and alternative forms, specific embodiments thereof are shown by way of example in the drawings and will herein be described in detail. It should be understood, however, that the drawings and detailed description thereto are not intended to limit the embodiments to the particular form disclosed, but on the contrary, the intention is to cover all modifications, equivalents and alternatives falling within the spirit and scope of the appended claims. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112(f) for that unit/circuit/component.

DETAILED DESCRIPTION OF EMBODIMENTS

In the following description, numerous specific details are set forth to provide a thorough understanding of the embodiments described in this disclosure. However, one having ordinary skill in the art should recognize that the embodiments might be practiced without these specific details. In some instances, well-known circuits, structures, and techniques have not been shown in detail for ease of illustration and to avoid obscuring the description of the embodiments.

Referring to FIG. 1, a block diagram illustrating one embodiment of a processor core 100 is shown. In the illustrated embodiment, processor core 100 includes an instruction fetch unit (IFU) 110, a core interface 170, compression/decompression Unit 180, execution units 130, and last level cache 190. Execution units 130 are coupled to load store unit (LSU) 150, which is also coupled to send data back to execution units 130. Additionally, LSU 150 is coupled to core interface 170, which may, in turn, be coupled to last level cache 190. In the illustrated embodiment, last level cache 190 includes bus interface unit (BIU) 195, which is coupled to main memory via an on-chip network, such as internal bus 105 as shown in FIG. 1, for example. It is noted that the embodiment illustrated in FIG. 1 is merely an example and that some circuit blocks have been omitted for clarity. In other embodiments, different numbers of circuit blocks and different arrangements of circuit blocks may be employed.

In some embodiments, processor core 100 is a standalone processor in a computing system. In other embodiments, processor core 100 is one of multiple cores of a multi-core processor. In yet other embodiments, the multi-core processor including processor core 100 is one of multiple dies on a system-on-a-chip (SOC). In various embodiments, processor core 100 is used in a computing system within a desktop computer, a portable computer, a tablet computer, a smartphone, a mobile device, a server, a peripheral device, or otherwise.

In various embodiments, the compression/decompression unit 180 offloads the rest of the processor core 100 from performing operations of a compression/decompression algorithm. Therefore, the rest of processor core 100 is available for processing other operations while the compression/decompression unit 180 processes the compression/decompression algorithm. In some embodiments, compression/decompression unit 180 compresses and decompresses data based on one of a variety of dictionary-based algorithms. In other embodiments, compression/decompression unit 180 compresses and decompresses data based on one of a variety of hybrid algorithms that uses a combination of a statistical-based algorithm and a dictionary-based (table-based) algorithm. As used herein, a "dictionary" (also referred to as a "table") is a data structure (hardware and/or software based) comprising multiple entries where each entry is configured to store a data value that has undergone a compression process. During the compression process, data values to be compressed are compared to values stored in the dictionary to determine if they have been seen before (e.g., either in whole or in part).

As shown, compression/decompression unit 180 includes a compression engine 182 and a decompression engine 184. Each of the engines 182 and 184 includes multiple hardware lanes for parallel processing of the compression/decompression algorithm operations. Therefore, throughput increases during compression/decompression operations as multiple portions of data are compressed/decompressed simultaneously by the multiple hardware lanes. In an embodiment, each portion of data sent for compression is an input word of a known size. In one example, a 32-bit input word is the portion of data although a variety of other sizes are possible and contemplated.

In some embodiments, the algorithm operations are pipelined, which further increases throughput. Further, although dependencies exist between the multiple input words currently assigned to the hardware lanes of the compression engine 182, in an embodiment, a different second group of input words is assigned to the hardware lanes prior to the dependencies between the input words of the first group are determined. Accordingly, although the second group depends on dictionary updates by the first group, the second group is assigned to the hardware lanes of the compression engine 182 prior to the dependencies between the input words of the first group are determined. Due to the relatively high throughput of the engines 182 and 184, the amount of instructions and data being used for processing multiple software applications is permitted to grow without long latency swapping between the local cache memories and the persistent storage although the memory storage locations in the local cache memories have a limited amount of storage space.

As described below in more detail, compression/decompression unit 180, in response to detecting a compression or decompression command/instruction defined in the instruction set architecture (ISA) for processor core 100, compresses or decompresses a page of data as a group of multiple input words at a time. In some embodiments, additional instructions may be added to the ISA of processor core 100. In various embodiments, two instructions with opcodes indicating encode/compress and decode/decompress, respectively, are added to the ISA for performing data compression and decompression. In some embodiments, the instructions use one or more arguments specifying an address of a source page and an address of a destination or target page in memory. In some embodiments, each of the two instructions is converted into multiple micro-operations, which are also referred to as "micro-ops." The compression/decompression unit 180 processes the micro-ops.

In various embodiments, compression/decompression unit 180 provides information to last level cache 190 to prefetch a page of data for compression or decompression. In some cases, a request for the page of data may be sent to main memory through the bus interface unit (BIU) 195. The prefetched page of data may be stored in last level cache 190, or another suitable location. Once the prefetched page of data has been stored in last level cache 190, the page may be transferred to a read buffer included in compression/decompression unit 180. One of the engines 182 and 184 processes the received page. Before further describing the engines 182 and 184, a further description of the rest of the processor core 100 is first provided.

Instruction fetch unit (IFU) 110 provides instructions to the rest of processor core 100 for execution. In the illustrated embodiment, IFU 110 may be configured to perform various operations relating to the fetching of instructions from cache or memory, the selection of instructions from various threads for execution, and the decoding of such instructions prior to issuing the instructions to various functional units for execution. IFU 110 further includes an instruction cache 114. In one embodiment, IFU 110 may include logic to maintain fetch addresses (e.g., derived from program counters) corresponding to each thread being executed by processor core 100, and to coordinate the retrieval of instructions from instruction cache 114 according to those fetch addresses. Additionally, in some embodiments IFU 110 may include a portion of a map of virtual instruction addresses to physical addresses. The portion of the map may be stored in an instruction translation lookaside buffer (ITLB), such as ITLB 115, for example.

Execution unit 130 may be configured to execute and provide results for certain types of instructions issued from IFU 110. In one embodiment, execution unit 130 may be configured to execute certain integer-type and floating-point instructions defined in the implemented ISA, such as arithmetic, logical, and shift instructions. It is contemplated that in some embodiments, processor core 100 may include more than one execution unit, and each of the execution units may or may not be symmetric in functionality.

Load store unit (LSU) 150 may be configured to process data memory references, such as integer and floating-point load and store instructions. In some embodiments, LSU 150 may also be configured to assist in the processing of instruction cache 114 misses originating from IFU 110. LSU 150 includes data cache 152 as well as logic configured to detect cache misses and to responsively request data from a particular cache memory via cache interface 170. In one embodiment, data cache 152 may be configured as a write-through cache in which all stores are written to a particular cache memory regardless of whether they hit in data cache 152. In other embodiments, data cache 152 may be implemented as a write-back cache.

In one embodiment, LSU 150 may include a miss queue configured to store records of pending memory accesses that have missed in data cache 152 such that additional memory accesses targeting memory addresses for which a miss is pending may not generate additional cache request traffic. In the illustrated embodiment, address generation for a load/store instruction may be performed by one of execution unit(s) 130. Depending on the addressing mode specified by the instruction, one of execution unit(s) 130 may perform arithmetic (such as adding an index value to a base value, for example) to yield the desired address. Additionally, in some embodiments LSU 150 may include logic configured to translate virtual data addresses generated by execution unit(s) 130 to physical addresses. For example, in the present embodiment, LSU 150 includes a data translation lookaside buffer (DTLB) 153.

Figure 2:
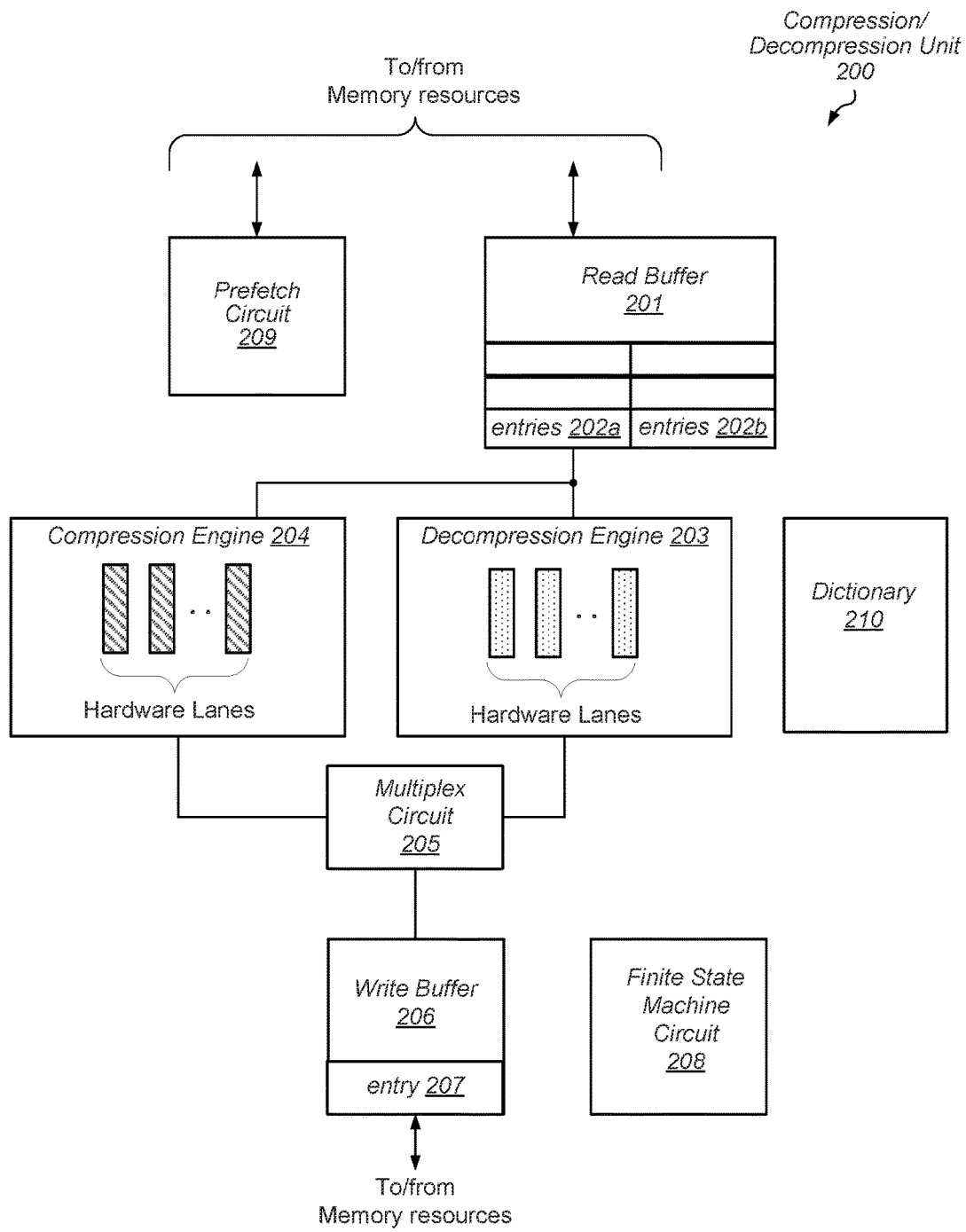
FIG. 2 is a block diagram of one embodiment of a compression/decompression unit.

Turning to FIG. 2, a block diagram illustrating one embodiment of a compression/decompression unit 200 is illustrated. Compression/decompression unit 200 may, in various embodiments, correspond to compression/decompression unit 180 as depicted in the embodiment of FIG. 1. In the illustrated embodiment, compression/decompression unit 200 includes read buffer 201, compression engine 204, decompression engine 203, dictionary 210, multiplex circuit 205, write buffer 206, finite state machine circuit 208, and prefetch circuit 209. It is noted that the embodiment depicted in the block diagram of FIG. 2 is merely an example. In other embodiments, different circuit blocks and different arrangement of circuit blocks are possible and contemplated.

Read buffer 201 may include multiple entries, such as, e.g., entries 202a and 202b, into which portions of a page of data may be stored. In various embodiments, the entries may be organized to allow for the parallel processing of multiple words of data. For example, in some embodiments, the entries may be arranged to allow for the reading of a given number of 32-bit data words by either compression engine 204 or decompression engine 203. In some cases, four 32-bit data words are read by either compression engine 204 or decompression engine 203. In other cases, another number of data words is possible and contemplated. Read buffer 201 may be further configured to receive a ready signal from each of compression engine 204 and decompression engine 203 indicating that the multiple parallel hardware lanes in those engines are ready to receive more data.

In some cases, if read buffer 201 is not ready to receive requested data, the data may be held in buffers included in a bus interface unit (BIU). In an embodiment, the BIU may be coupled to a communication bus that allows for data to be moved between various cache memories and system memory. In some embodiments, read buffer 201 may use a credit-based system to request data from a low-level cache memory, such as, data cache 252, for example. As described below in more detail, each of compression engine 204 and decompression engine 203 may be configured to compress or decompress, respectively, portions of data received from read buffer 201. In some embodiments, compression engine 204 and decompression engine 203 compresses and decompresses data based on one of a variety of dictionary-based algorithms. In other embodiments, compression engine 204 and decompression engine 203 compresses and decompresses data based on one of a variety of hybrid algorithms that uses a combination of a statistical-based algorithm and a dictionary-based algorithm.

In various embodiments, dictionary 210 may include multiple entries, each of which corresponds to a given index and is configured to store a commonly used sequence of bits and. In some embodiments, each entry may be configured to store an index. In other embodiments, entries do not store an index. In some cases, dictionary 210 may be implemented as a content-addressable memory (CAM), which is accessed using a hash output created from bits of a particular word of data to be compressed. In other cases, dictionary 210 may be implemented as a direct-mapped data storage structure, such as a table, where table entries remain a constant corresponding to an index. For example, table entry 7 remains the seventh entry of the dictionary 210 throughout the use of the dictionary 210. Therefore, no index value is stored in the entries. Dictionary 210 may be designed according to one of various designs styles. For example, dictionary 210 may include multiple latches, flip-flops, random access memory (RAM) cells, or other suitable storage circuits configured to store individual data bits included in the various entries.

As part of compression and decompression operations, compression engine 204 and decompression engine 203 may access dictionary 210. During compression and decompression operations, compression engine 204 and decompression engine 203 may update one or more entries in dictionary 210 in order to improve subsequent compression operations. In some embodiments, the compression operations and decompression operations are pipelined, which further increases throughput. Additionally, although dependencies exist between the multiple input words currently assigned to the hardware lanes of the compression engine 203, in an embodiment, a different second group of input words is assigned to the hardware lanes prior to the dependencies between the input words of the first group are determined. Accordingly, although the second group depends on updates of dictionary 210 by the first group, the second group is assigned to the hardware lanes of the compression engine 203 prior to the dependencies between the input words of the first group are determined.

Multiplex circuit 205 may include multiple individual data bit multiplex circuits allowing the selection of an output from either compression engine 204 or decompression engine 203 dependent upon the command being executed. Finite state machine circuit 208 may be configured to generate multiple signals to control the operation of the various other circuit blocks included in compression/decompression unit 200. In various embodiments, finite state machine circuit 208 may receive compression and decompression instructions/commands from an instruction fetch unit, and signal prefetch circuit 209 to initiate a prefetch of a page of data specified in the received command. Finite state machine circuit 208 may additionally, control the copying of data from write buffer 206 to target storage locations. In various embodiments, finite state machine circuit 208 may include multiple sequential and combinatorial logic circuits configured to perform the above-referenced functions.

Prefetch circuit 209 may include any suitable combination of sequential and combinatorial logic circuit that may be configured to fetch a number of lines into a low-level cache, such as, e.g., data cache 252 as illustrated in the embodiment of FIG. 2. In some embodiments, prefetch circuit 209 may send prefetch requests to the computing system based on a number of available credits. Prefetch circuit 209 may, in some embodiments, perform the prefetching dependent upon a stride value. For example, in the case of compression, a processor core may prefetch the first N (where N is a positive integer) line of the desired page, and prefetch circuit 209 may prefetch from the source address plus N to the end of the desired page of data, incrementing by the stride after each line has been prefetched.

Figure 3:
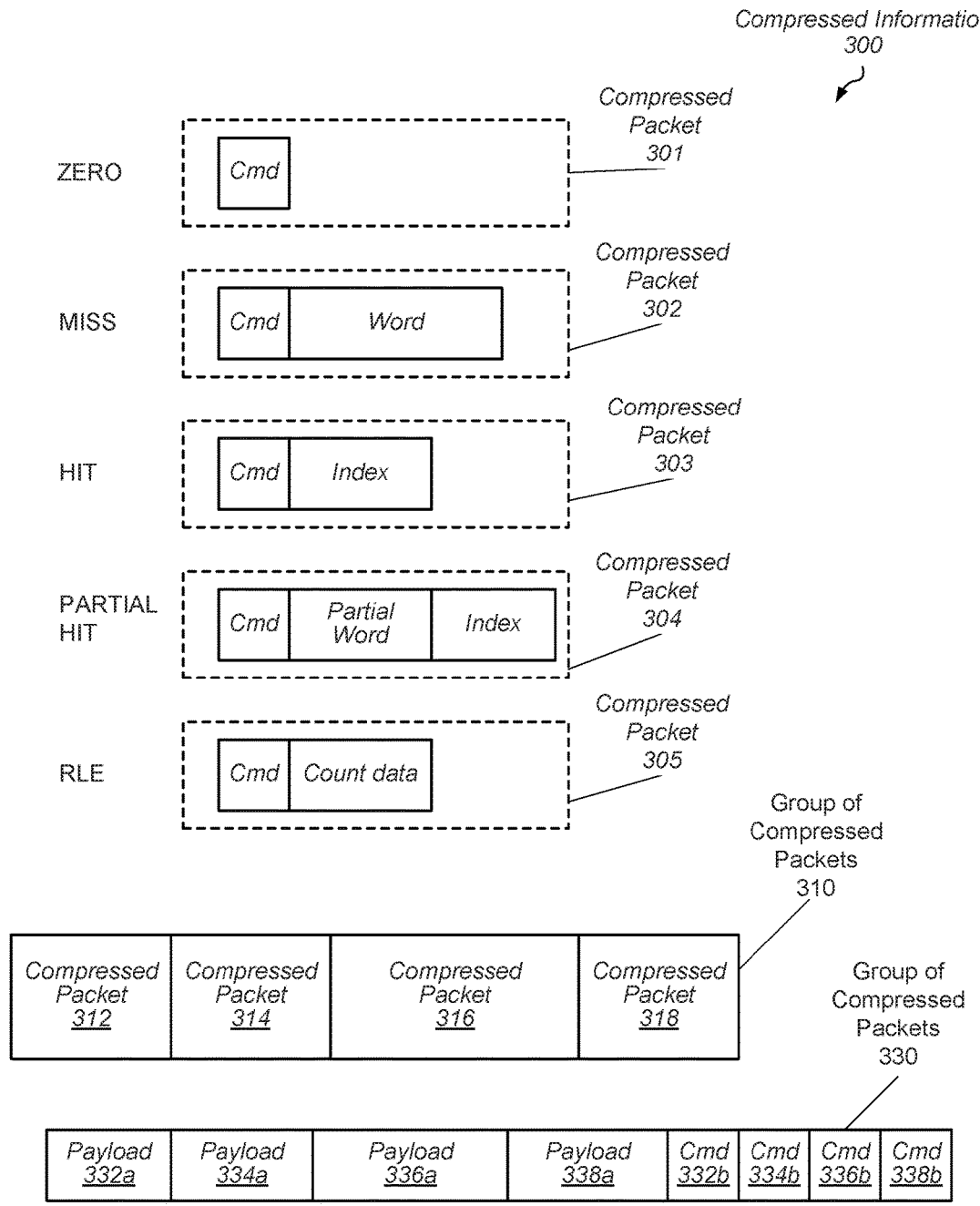
FIG. 3 is a block diagram of one embodiment of compressed information.

Turning to FIG. 3, a block diagram illustrating one embodiment of compressed information 300 is shown. In an embodiment, compressed information 300 includes one or more of compressed packets 301-305, group of compressed packets 310 and group of compressed packets 330. The types of compressed information depicted in FIG. 3 are merely examples. In other embodiments, a compression/decompression unit generate and use different packet types which may include different arrangements of commands and data.

In various embodiments, each compressed packet includes a command and possible other additional information depending upon the results of the comparison to the dictionary. In an embodiment, each command is a combination of data bits that encode the particular packet type. If the data bits for a portion of data being operated upon are all zeros, then compressed packet 301 may be used in the compressed page of data for that portion of data. Compressed packet 301 merely includes a command specifying that all the data bits in the uncompressed file were zero.

When the portion of data is compared to the dictionary, in some embodiments, one of three possibilities exists. If the sequence of data bits in the portion of data does not match any of the entries in the dictionary, then a miss occurs and compressed packet 302 may be used in the compressed page of data for the portion of data. Compressed packet 302 includes a command designating that this sequence of bits was not found in the dictionary, as well as a copy of the original portion (word) of data. It is noted that in some embodiments, a miss may result in a compression engine modifying the dictionary to include a new entry that would allow for a match to the portion of the data, provided space is available in the dictionary. In other embodiments, a miss results in the compression engine replacing an entry of the dictionary with data of a copy of the word. The entry is pointed to by the index generated from the data of the word.

If the portion of data matches an existing entry in the dictionary, then hit has occurred and the compressed packet 303 may be used in the compressed page of data for the portion of data. Compressed packet 303 includes a command indicating that the portion of data matched an entry in the dictionary as well as an index pointing to the matched entry in the dictionary. In various embodiments, the index may be a hash of the portion of the data.

In some cases, the portion of data may partially match an entry in the dictionary. When this occurs, compressed packet 304 may be used in the compressed page of data for the portion of the data. Compressed packet 304 may include a command designating the partial hit, along with an index or hash corresponding to the entry in the dictionary that partially matches the portion of data, along with the partial word from the portion of data that does not match the entry. In various embodiments, the number of bits of data which match between the portion of data and a given entry in the dictionary may be adjustable dependent upon any suitable criteria.

In some embodiments, each of the compressed packets 301 (zero) and 303 (hit) does not modify the dictionary while the compressed packets 302 (miss) and 304 (partial hit) do have information stored in the dictionary. In an embodiment, the entire 32-bit word (or other selected word length) is stored in the dictionary as described earlier. In some embodiments, the word written to the dictionary replaces the word read from the dictionary and used to perform the comparisons between the dictionary word and the words in a current group being processed. In one example, if each of three words in a current group have a same index, such as index 7, then entry 7 of the dictionary is accessed such as by a read request. The word in entry 7 is retrieved from the dictionary and compared to the three words in the current group.

If the first two words of the current group match the word from entry 7 of the dictionary, then the two comparisons result in hits and the compressed packet 303 is generated for each of these two words. No modification of the dictionary is performed for these two words. However, if the third word of the current group does not match the word from entry 7, then the comparison results in a miss and the compressed packet 302 is generated for this third word. Additionally, this third word is added to the dictionary. In an embodiment, this third word replaces the word in entry 7 of the dictionary. Therefore, the dictionary is updated for this third word.

Similar to the above example, a partial hit comparison result also leads to updating the dictionary. If a portion of the third word matches the word in entry 7, but another different portion does not match, then the comparison results in a partial hit. For partial hits, the compressed packet 304 is generated. In an example, if bits 10 through 31 of the 32-bit third word in the current group match bits 10 through 31 of the 32-bit word retrieved from entry 7 of the dictionary, then the comparison results in a partial hit. Bits 0 through 9 are stored in the compressed packet 304 while the entire 32 bits of this third word replace the word in entry 7 of the dictionary.

As can be seen in the illustrated embodiment in FIG. 3, each of the compressed packets 303 (hit) and 304 (partial hit) store the generated index. Therefore, during a later decompression operation, the index is not regenerated as the index can be retrieved from the compressed packet. The compressed packet 301 (zero) does not store an index, but during a later decompression operation, the index is not regenerated. The compressed packet 302 (miss) does not store the generated index. Therefore, during a later decompression operation, the index is regenerated from the contents of the word in the compressed packet 302.

A fifth type of packet may also be employed. Compressed packet 305 may include a command indicating a count of a number of repeated packets. Such packets may be used to replace multiple identical packets with a particular packet followed by a run-length encoding (RLE) packet indicating how many times the particular packet occurred in the sequence. By employing RLE packets, further compression may be achieved by storing only a single copy of a repeated packet in a sequence along with a number of times the packet is to be repeated, instead of all instances of the repeated packet.

In some embodiments, compressed packets, such as those illustrated in FIG. 3, may be combined to form a group. The group of compressed packets 310 depicts a particular embodiment of a group of compressed packets. In the illustrated embodiment, compressed packets 312, 314, 316 and 318 are concatenated together into a single group that may be written into a target storage location. In some cases, however, it may be desirable to separate commands from their corresponding payloads in the various compressed packets. An embodiment of a group of compressed packets 330 employing such a technique is illustrated in FIG. 3. In the illustrated embodiment, Payloads 332a, 334a, 336a and 338a are concatenated together. Similarly, commands Cmd 332b, 334b, 336b and 338b, which correspond to Payloads 332a through 338a, may then be concatenated onto the previously concatenated payloads.

Figure 4:
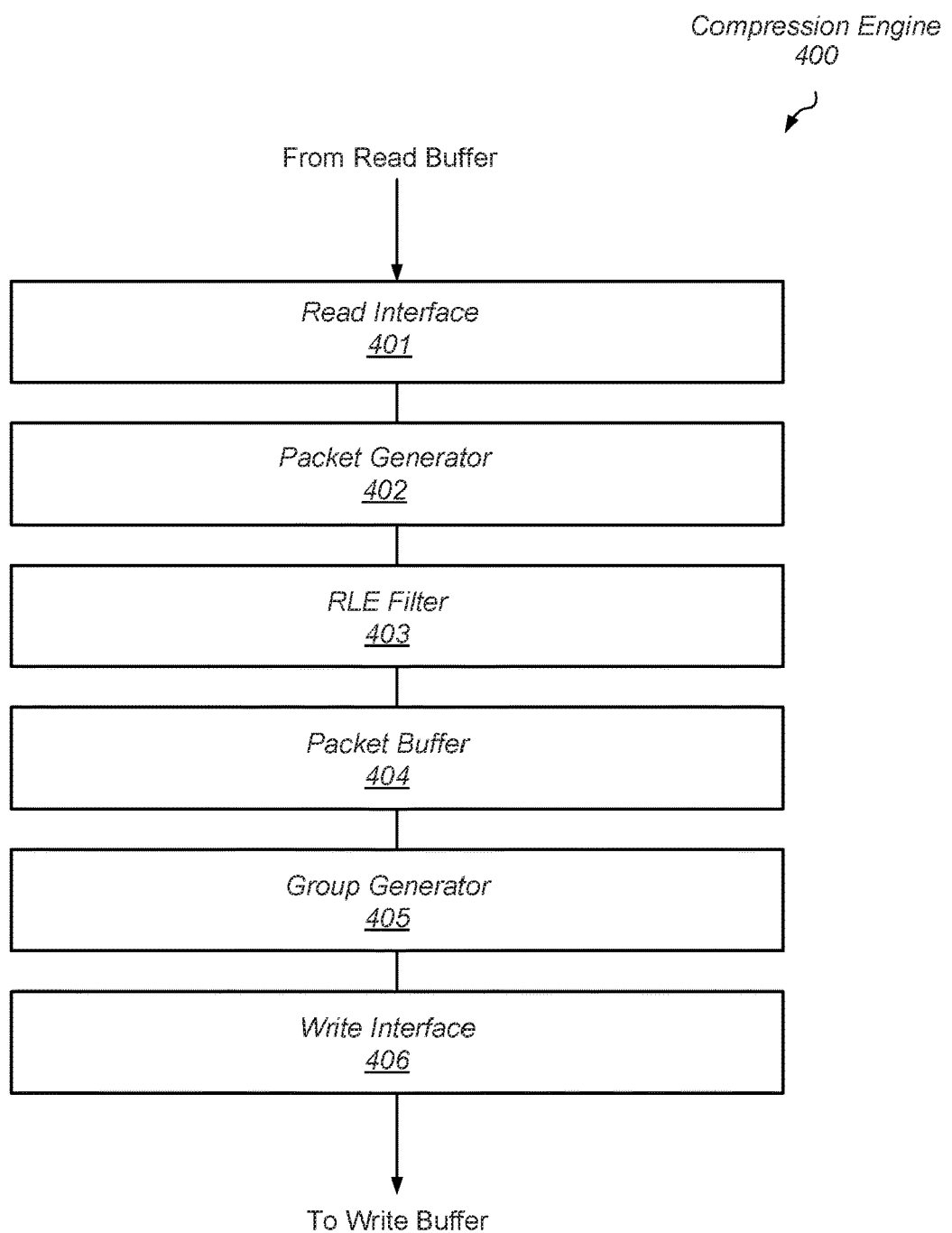
FIG. 4 is a block diagram of one embodiment of a compression engine.

Turning to FIG. 4, a block diagram illustrating one embodiment of a compression engine 400 is illustrated. In various embodiments, compression engine 400 corresponds to compression engine 204 as illustrated in the embodiment of FIG. 2. In the illustrated embodiment, hardware lane 400 includes read interface 401, packet generator 402, RLE filter 404, packet buffer 404, group generator 405, and write interface 406. In various embodiments, each of the components 401 through 406 includes multiple hardware lanes. It is noted that the embodiment illustrated in FIG. 4 is merely an example. In other embodiments, different circuit blocks and different arrangement of circuit blocks may be employed.

In various embodiments, read interface 401 reads multiple words from a read buffer, such as, e.g., read buffer 201 as illustrated in FIG. 2. For example, in some embodiments, read interface 401 may read four 32-bit words, in parallel, from the read buffer. In other embodiments, another number of words and another word size are possible and contemplated. Read interface 401 may additionally perform some checking on the data read from the read buffer. For example, read interface 401 may check to determine if one of the words contain all zeros with zero detect logic. Additionally, read interface 401 may check if any of the words is the same or partially the same as one or more of the other words.

Additionally, read interface 401 may compute a hash or index to be used with dictionary lookup, and check to see if any of the words have the same index. In one example, a 4-bit index is used to access a direct-mapped, 16-entry dictionary. In some embodiments, read interface 401 may perform an exclusive-OR Boolean operation between particular bits of a given 42-bit word in order to generate the 4-bit index. In other embodiments, read interface 401 accesses a hash table based on particular bits of a word to generate the index. In yet other embodiments, a hash function is performed on particular bits of a given word to generate the index. Further, a combination of one or more of a table lookup, one of a variety of hash functions, and one of a variety of Boolean logic functions is used to generate the index. When generating an index to use to access the dictionary, the compression engine 400 is performing a combination of a statistical-based compression algorithm and a dictionary-based compression algorithm.

In an embodiment, the words of a group are read by the read interface 401 such that the left-most word is an oldest word of the group and the right-most word is a youngest word of the group. Words in between the oldest word and the youngest word are ordered in a similar manner. In other embodiments, the right-most word is an oldest word of the group and the left-most word is a youngest word of the group. In some embodiments, when two or more words have a same index, a single read request is sent to the dictionary, rather than multiple read requests with one from each word. In an embodiment, the read interface 401 generates a read request only for the oldest word of the two or more words with a same index and sends the read request with the generated index to the dictionary on behalf of the other words of the two or more words with a same index.

Read interface 401 may include multiple flip-flop circuits, latches and other sequential elements in order to store the words before sending them to packet generator 402. Additionally, in some embodiments, read interface 401 includes two or more pipeline stages. Therefore, in an embodiment, a read request for the contents of a particular entry of the dictionary, such as on behalf of two or more words with a same index, is stored in pipeline sequential elements at the end of a first pipeline stage. The read request is sent in the later second pipeline stage to the dictionary while a next group of words are read from the read buffer and indexes are generated for the next group.

In various embodiments, packet generator 402 generates a compressed packet for each of the words received from read interface 401. Packet generator 402 generates packets similar to those depicted in FIG. 3 by comparing a given word to one or more entries in the dictionary. In one embodiment, the given word is compared to each entry in the dictionary using CAM-based comparison circuitry. In other embodiments, an index specifying a particular entry of the dictionary is used for access of the dictionary and for retrieving a word to use in a comparison. However, for parallel execution by multiple hardware lanes, packet generator 402 generates packets similar to those depicted in FIG. 3 by comparing a given word to a word from another hardware lane, rather than contents retrieved from the dictionary. The selection logic is based on the loading of the pipeline stages of the multiple hardware lanes. Further details are provided with examples later. Packet Generator 402 may determine an appropriate command and payload based on the performed comparison. Packet Generator 402 may also include multiple flip-flop circuits for storing the generated packets before sending them to RLE Filter 403.

RLE Filter 403 may include a sequential logic circuit or state machine configured to track a sequence of similar packets. The similar packets may be, for example, a sequence of ZERO packets, i.e., packets that include all zero data bits, or a sequence of HIT packets to the same dictionary index. Once a start of a possible sequence is detected, such as, e.g., a ZERO packet, RLE Filter 403 may track a subsequent number of packets in the sequence. Once the sequence ends, RLE Filter 403 may generate a RLE packet indicating a number of times to replicate a particular packet. The initial packet in the sequence and the RLE packet may be stored, thereby reducing a number of packets that need to be stored. The RLE packet may be used during decompression to generate additional copies of the packet starting the sequence.

Packet Buffer 404 may include multiple flip-flop or other suitable storage circuits necessary to store the packets prior to group generation by Group Generator 405. In various embodiments, Group Generator 405 may include multiple multiplex circuits and shift registers. The multiplex circuits and shift registers, along with other logic circuits, may be arranged to allow the formation of a group of packets. The format of the group of packets may, in some embodiments, correspond to the format of the packet group illustrated in FIG. 3.

Write Interface 406 may include multiple buffers into which groups are packed. In various embodiments, Write Interface 406 may pack multiple groups into a single buffer until the buffer is full, at which point, the contents of the buffer may be written to a write buffer awaiting to be copied into the target storage location. Since packets may be of various sizes, groups may also be of various sizes. As such, multiple groups may be combined in a single buffer. The buffers included in Write Interface 406 may be arranged to allow for pipelined operation within Write Interface 406.

Figure 5:
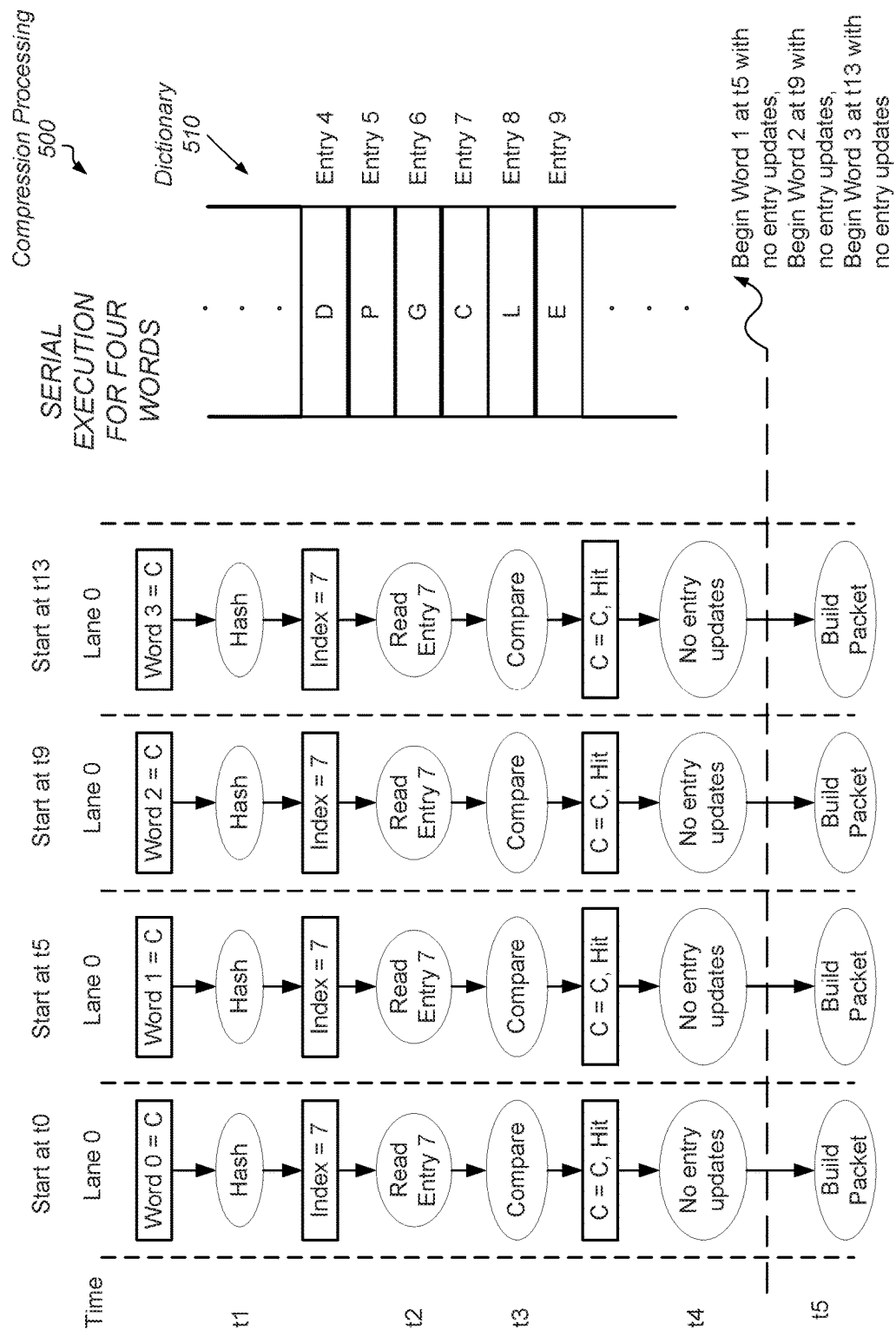
FIG. 5 is a block diagram of one embodiment of compression processing.

Referring now to FIG. 5, a block diagram illustrating one embodiment of compression processing 500 is shown. In the illustrated embodiment, serial execution is performed for a hybrid compression algorithm that uses a combination of a statistical-based compression algorithm and a dictionary-based compression algorithm. As shown, a single hardware lane is used, which is referred to as "Lane 0." Compression processing with parallel execution in multiple hardware lanes is provided afterward. Although Lane 0 is shown four times, it is for ease of illustration and only a single hardware lane is used in this illustrated example. Portions of data being compressed are referred to as words. As shown, dictionary 510 stores recently seen words in multiple entries. In the example shown, dictionary 510 is a direct-mapped data storage structure, such as a table. Dictionary 510 may include multiple latches, flip-flops, random access memory (RAM) cells, or other suitable storage circuits configured to store individual data bits included in the various entries.

As shown, at time t0, Lane 0 is loaded with Word 0=C. Here, "C" is used as a generic value to represent a multi-bit value. Hexadecimal and other representations are not used here. For example, the value "C" may represent a 32-bit word. At time t1, an index is generated by a hash function and the resulting index is 7. At time t2, a read request is generated. The read request specifies the index as 7. The read request is sent to dictionary 510 and entry 7 is accessed. The value stored in entry 7, which is the value C, is copied and returned to Lane 0.

At time t3, comparison logic in Lane 0 compares two values. The first value is the value C retrieved from entry 7 of dictionary 510. The second value is the value of Word 0, which is C. The comparison result is a Hit. At time t4, logic within Lane 0 determines there are no updates for dictionary 510. At time t5, two operations are begun. A first operation is loading Lane 0 with Word 1=C. A second operation is building a packet for Word 0. Regarding the first operation, for the case of Word 0=C, no updates are performed for dictionary 510. However, if updates did occur at time t4, then those updates need to finish before any read request for Word 1=C is sent to dictionary 510. Loading Lane 0 with Word 1=C is shown in the second copy of Lane 0. Regarding the second operation, in an embodiment, the generated compressed packet is similar to those depicted in FIG. 3. For example, the compressed packet 303 may be generated for Word 0.

As shown, at time t5, Lane 0 is loaded with Word 1=C. Again, loading Lane 0 with Word 1=C is shown in the second copy of Lane 0. An index is generated by a hash function and the resulting index is 7. At time t6 (not shown for ease of illustration), a read request is generated. The read request specifies the index as 7. The read request is sent to dictionary 510 and entry 7 is accessed. The value stored in entry 7, which is the value C, is copied and returned to Lane 0. At time t7 (not shown), comparison logic in Lane 0 compares two values. The first value is the value C retrieved from entry 7 of dictionary 510. The second value is the value of Word 1, which is C. The comparison result is a Hit.

At time t8 (not shown), logic within Lane 0 determines there are no updates for dictionary 510. At time t9 (not shown), two operations are begun. A first operation is loading Lane 0 with Word 2=C. A second operation is building a packet for Word 1. The operations are repeated for Word2 and Word 3. As shown, the operations at time t1 and t5 may be done in parallel, so although a serial implementation is shown with a single hardware lane, the processing of a subsequent word can begin before a compressed packet is generated for an earlier word. Accordingly, other pipeline stages may be used both between the times indicated, such as time t1 through t5, and within the times indicated. For example, at time t1, a first pipeline stage may load a word and a second pipeline stage may generate the index. However, a dependence exists between words such as updating dictionary 510 based on the comparison results and reading an entry from dictionary 510.

Figure 6:
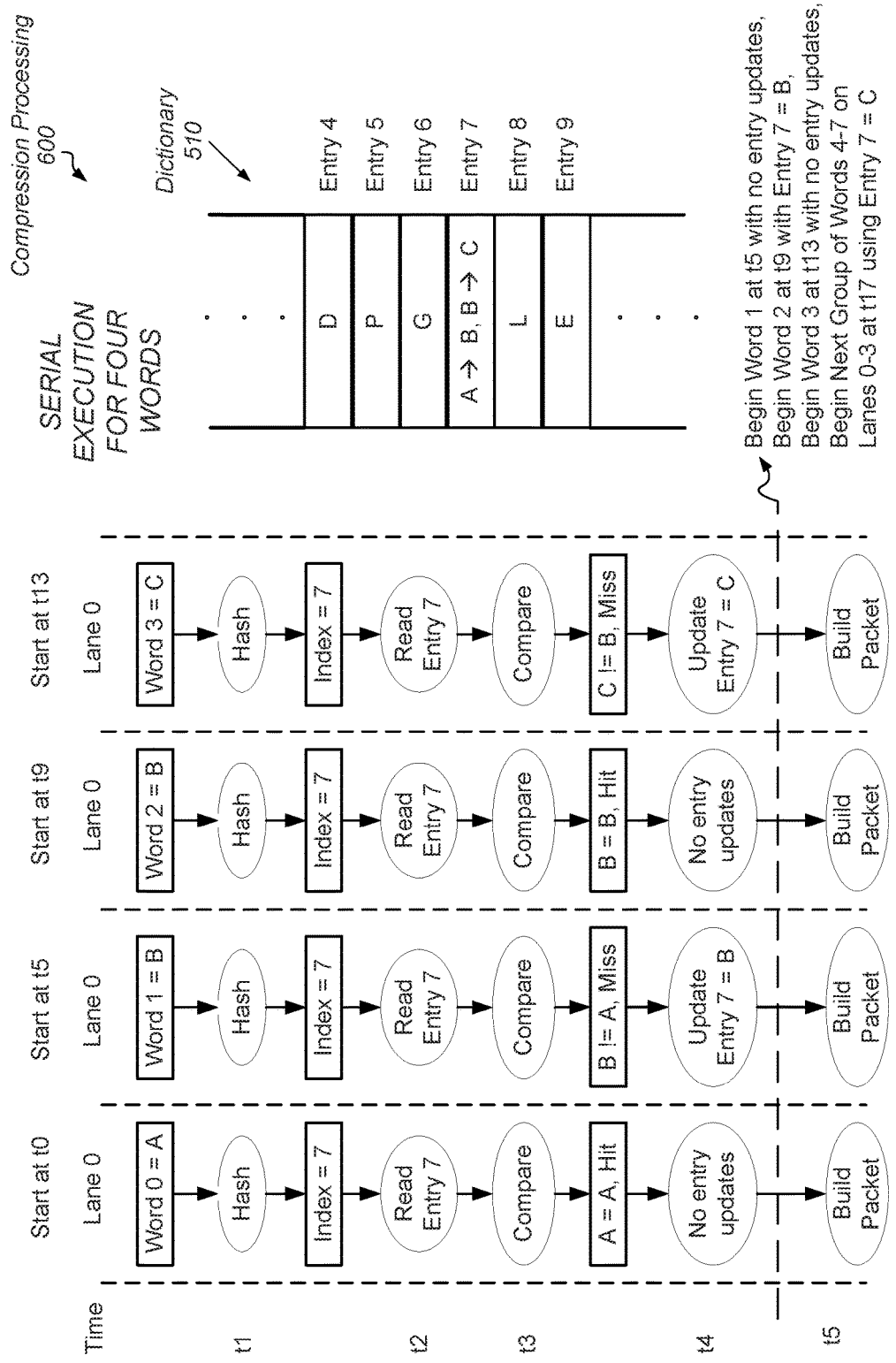
FIG. 6 is a block diagram of another embodiment of compression processing.

Referring now to FIG. 6, a block diagram illustrating another embodiment of compression processing 600 is shown. In the illustrated embodiment, serial execution is performed for a hybrid compression algorithm that uses a combination of a statistical-based compression algorithm and a dictionary-based compression algorithm. As shown, a single hardware lane is used, which is referred to as "Lane 0." Dictionary 510, which was described earlier, is numbered identically.

As shown, at time t0, Lane 0 is loaded with Word 0=A. The operations performed at times t1 through t5 are the same as described in FIG. 5. However, here, the value stored in entry 7 of dictionary 510 is A. At time t5, Lane 0 is loaded with Word 1=B. Although the value B is different from the value A, the subset of the value B used by the hash function generates a same index, which is 7. In one example, the subset is bits 10 through 17 of a 32-bit word. Therefore, at time t7 (not shown, but equivalent to time t3), the comparison logic compares the value B of Word 1 and the value A retrieved from entry 7 of dictionary 510. In this example, the comparison result is a Miss. A comparison result of a Partial Hit is possible too, but in this example, a Miss is used. At time t8, the entry 7 of dictionary 510 is updated with the value B of Word 1, since Word 1 is now the most recently seen word.

At time t9, Lane 0 is loaded with Word 2=B and the index 7 is generated by the hash function. Therefore, at the later time t11 (not shown, but equivalent to time t3), the comparison logic compares the value B of Word 2 and the value B retrieved from entry 7 of dictionary 510. The comparison result is a Hit. Accordingly, dictionary 510 does not need updating.

At time t13, Lane 0 is loaded with Word 3=C. Although the value C is different from the values A and B, the subset of the value C used by the hash function generates a same index, which is 7. Therefore, at time t15 (not shown, but equivalent to time t3), the comparison logic compares the value C of Word 3 and the value B retrieved from entry 7 of dictionary 510. In this example, the comparison result is a Miss. A comparison result of a Partial Hit is possible too, but in this example, a Miss is used. At time t16, the entry 7 of dictionary 510 is updated with the value C of Word 3, since Word 3 is now the most recently seen word. As can be seen in this example, a dependence exists between words such as updating dictionary 510 based on the comparison results and reading an entry from dictionary 510. However, reading an entry of dictionary 510 for a given is independent of generating a compressed packet for a word older than the given word and processed previously to the given word.

Figure 7:
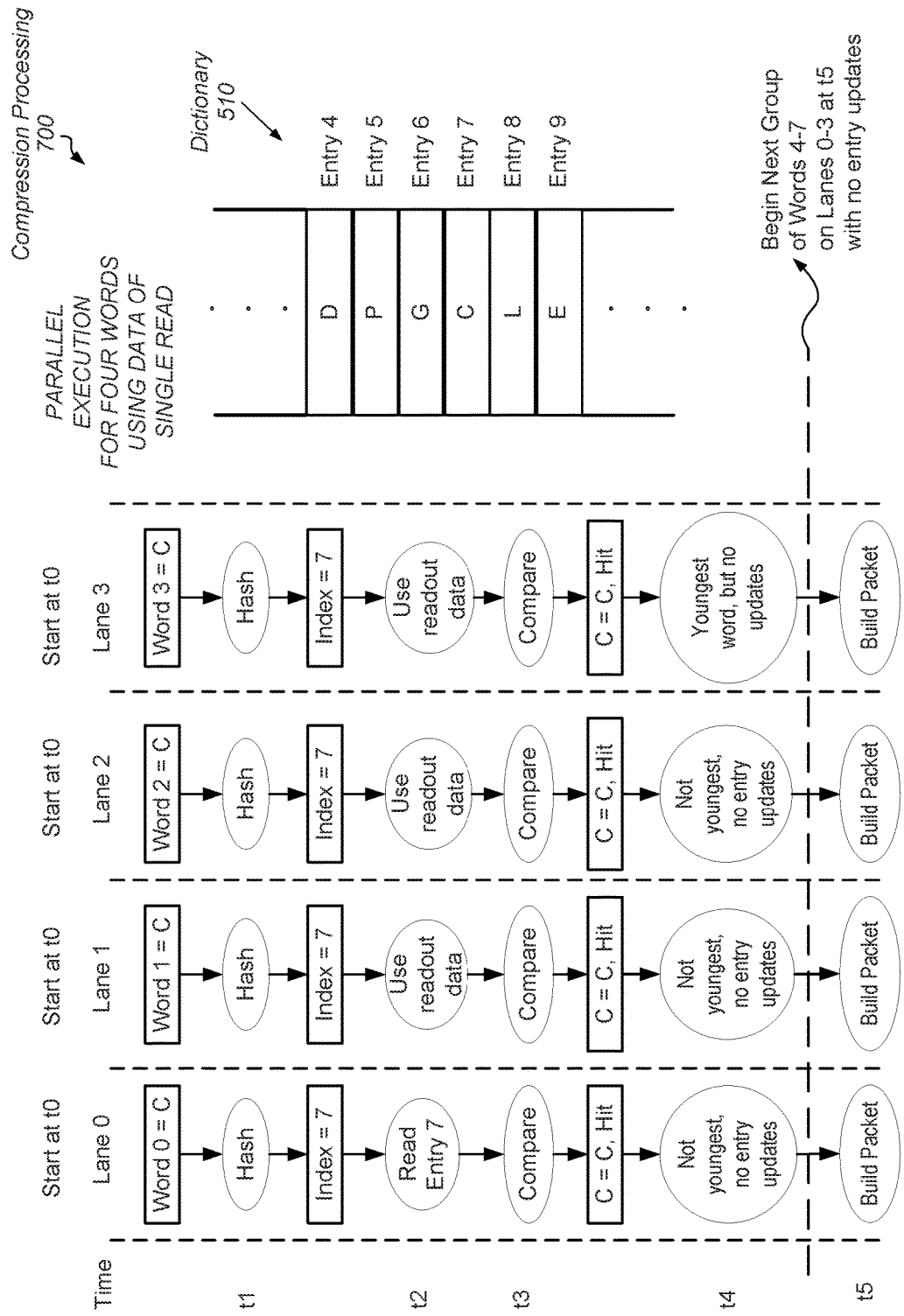
FIG. 7 is a block diagram of another embodiment of compression processing.

Referring now to FIG. 7, a block diagram illustrating one embodiment of compression processing 700 is shown. In the illustrated embodiment, parallel execution is performed for a hybrid compression algorithm that uses a combination of a statistical-based compression algorithm and a dictionary-based compression algorithm. As shown, multiple hardware lanes are used, which are referred to as "Lane 0," "Lane 1," "Lane 2," and "Lane 3." Although four hardware lanes are shown in the illustrated embodiment, another number of multiple hardware lanes is possible and contemplated. Dictionary 510, which was described earlier, is numbered identically.

As described earlier, pipeline stages may be used both between the times indicated, such as between each of time t1 through t5, and within the times indicated. For example, at time t1, a first pipeline stage may load multiple words and a second pipeline stage may generate an index for each of the multiple loaded words. Additionally, one or more of the times indicated may be placed in a same pipeline stage. For example, the operations performed at time t3 and t4 may be combined in a single pipeline stage if the operations complete within a given clock cycle. As shown, at time to, each of Lane 0 through Lane 3 is loaded with a respective one of Word 0 through Word 3. In this example, each one of Word 0 through Word 3 has the value C.

The operations performed at times t1 through t5 for a given hardware lane of Lane 0 through Lane 3 are the same as described in FIG. 5 for a single hardware lane with some adjustments. For example, at time t2, a single read request is sent from Lane 0 to dictionary 510 on behalf of the hardware lanes Lane 0 through Lane 3. In various embodiments, control logic in the compression engine determines each hardware lane of Lane 0 through Lane 3 accesses the same entry of dictionary 510. In various embodiments, the control logic is implemented in hardware circuitry. Therefore, it is known Lane 0 has the oldest word of the group of words Word 0 through Word 3. In this case, Word 0 is the oldest word, which is loaded in Lane 0.

Additionally, control logic determines Lane 3 has the youngest word of the group of words Word 0 through Word 3. In this case, Word 3 is the youngest word, which is loaded in Lane 3. A dependence exists between a first group of words, such as Word 0 through Word 3, and a second group of words such as a later group of loaded words with Word 4 through Word 7. In the illustrated embodiment of FIG. 7, the comparison results do not indicate an update of dictionary 510 is needed. However, if the value of Word 3=C was sent to dictionary 510 to update entry 7 of dictionary 510, no corruption occurs.

The updating of dictionary 510 based on the comparison results for Word 0 through Word 3 needs to finish before a read request is sent to dictionary 510 for any one of the later Word 4 through Word 7. However, the dependence is based on the update of dictionary 510 by the current youngest word, which is Word 3, rather than dependencies between any two words of Word 0 through Word 3. The next example highlights this fact.

Figure 8:
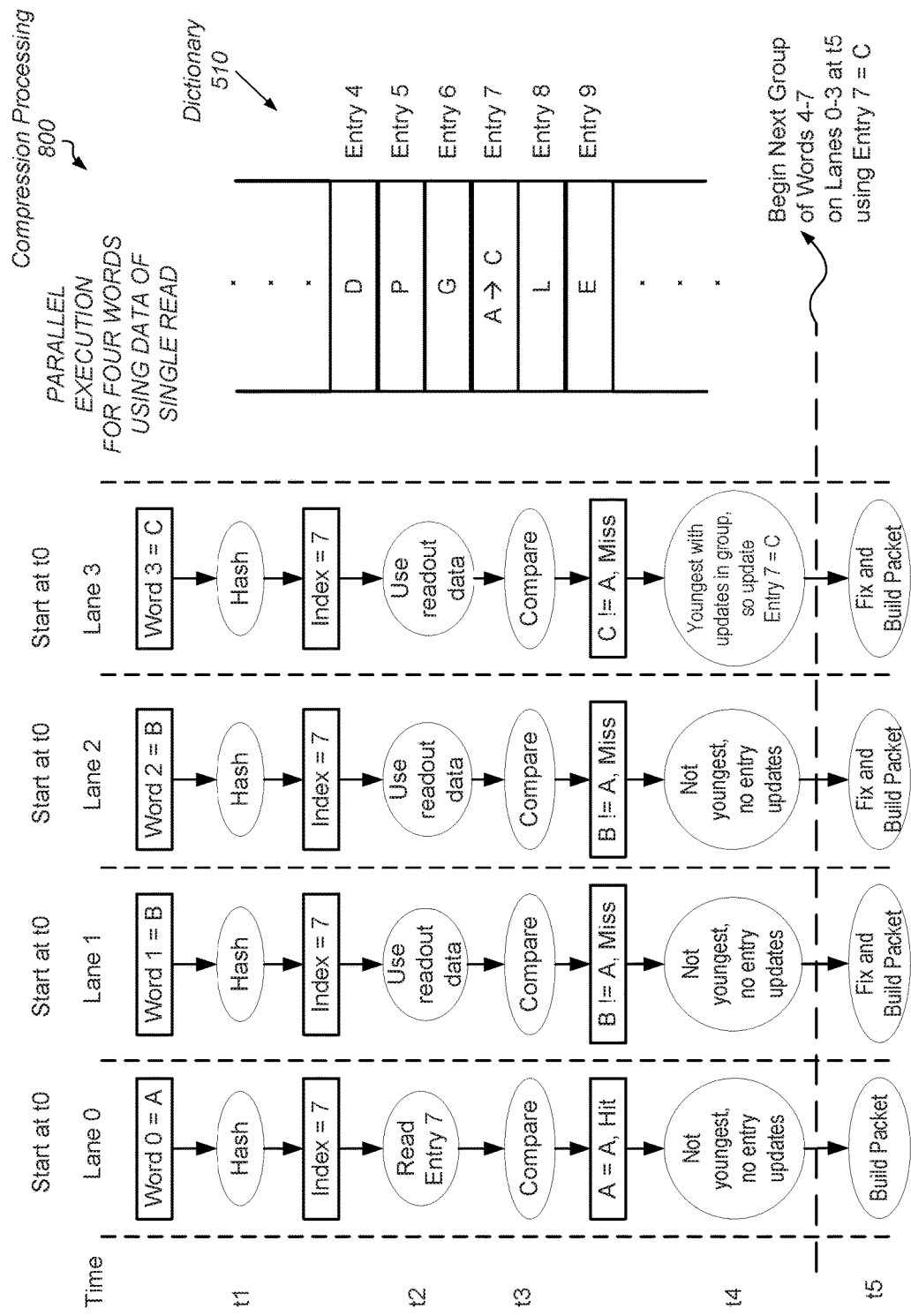
FIG. 8 is a block diagram of another embodiment of compression processing.

Referring now to FIG. 8, a block diagram illustrating another embodiment of compression processing 800 is shown. In the illustrated embodiment, parallel execution is performed for a hybrid compression algorithm again using the hardware lanes Lane 0 through Lane 3 and dictionary 510. As shown, at time t0, each of Lane 0 through Lane 3 is loaded with a respective one of Word 0 through Word 3. In this example, Word 0 has the value A, each of Word 1 and Word 2 has the value B and Word 3 has the value C. Entry 7 of dictionary 510 has the value A. The operations performed at times t1 through t5 for a given hardware lane of Lane 0 through Lane 3 are the same as described earlier with some adjustments. At time t1, when it is found each of Lane 0 through Lane 3 generates the same index 7, in various embodiments, control logic implemented in circuitry determines Lane 0 has the oldest word of the group of words Word 0 through Word 3 with the same index. Additionally, the control logic determines Lane 3 has the youngest word of the group of words Word 0 through Word 3 with the same index.

In some embodiments, when at least one word of Word 0 through Word 3 does not have the same index as another word, this at least one word does not yet pass to a next pipeline stage in order to simultaneously process only a group of words with the same index. For example, if Word 3 has an index of 12, then Word 0 through Word 2 may pass to a next pipeline stage for accessing dictionary 510 while Word 3 waits. However, Word 3 still moves along the pipeline stages ahead of a later Word 4. In other embodiments, when Word 3 has a different index, such as index 12 when the other words have a same index of 7 among them, Word 3 passes to the next pipeline stage. In such cases, dictionary 510 is either dual-ported to support two simultaneous accesses, or Word 3 waits in this later pipeline stage for accessing dictionary 510.

In another example, when Word 1 has an index of 12 while each of Word 0, Word 2 and Word 3 has an index of 7, in some embodiments, Word 0 is sent alone to a next pipeline stage. In a later clock cycle, Word 1 is sent alone to the next pipeline stage. In yet a later pipeline stage, each of Word 2 and Word 3 is sent to the next pipeline stage. Therefore, the ordering of the Word 0 through Word 3 is maintained and the generation of compressed packets has the same order. In other embodiments, each of Word 0, Word 2 and Word 3 are sent together in the next pipeline stage, but an indication is maintained specifying that Word 1 is younger than Word 0 and older than Word 2. In still yet other embodiments, each of Word 0 through Word 3 is sent to the next pipeline stage and dictionary 510 is dual-ported to support two simultaneous accesses.

Returning to the example with each of Word 0 through Word 3 having a same index of 7, at time t2, a single read request is sent from Lane 0 to dictionary 510 on behalf of the hardware lanes Lane 0 through Lane 3. At time t3, it is noted, each of the comparisons performed in Lane 0 through Lane 3 is between a value of a respective word for the lane and the value retrieved from entry 7 of dictionary 510. Therefore, a copy of the value A from entry 7 of dictionary 510 is used in each of Lane 0 through Lane 3 although dependencies exist between each of Word 0 through Word 3. For example, referring briefly again to FIG. 6, during serial execution, each of Word 2 and Word 3 is compared against the value B when the dependencies between words is taken into account. The updating of dictionary 510 occurred between the serial processing of each of Word 0 through Word 3. However, here in FIG. 8, during parallel execution, each of Word 2 and Word 3 is compared against the value A, which is a copy of entry 7 of dictionary 510 with no updating yet performed for dictionary 510. The comparison results shown in FIG. 8 with parallel execution by multiple hardware lanes are different than the comparison results shown in FIG. 6 with serial execution by a single hardware lane although the initial values for Word 0 through Word 3 and entry 7 are the same.

The comparison results in FIG. 6 can be used to generate compressed packets for each of Word 0 through Word 3 while the comparison results in FIG. 8 cannot be used to generate compressed packets for each of the Word 0 through Word 3. However, again, allowing any one of a later second group of words, such as Word 4 through Word 7, to access dictionary 510 is dependent upon the update of dictionary 510 by the current youngest word, which is Word 3, rather than dependencies between any two words of Word 0 through Word 3. Therefore, once the update of dictionary 510 by the current youngest word, which is Word 3, is known, the later second group of words, such as Word 4 through Word 7, is permitted to access dictionary 510. For example, the update for the youngest word may be forwarded (bypassed) to a read request from the later second group of words such as Word 4 through Word 7.

In the illustrated embodiment, at time t4, it is known Word 3 is the youngest word of the group of words (Word 0 through Word 3) with the same index (7), and additionally, it is known at least one update occurs for this group of words. For example, the comparison result of a Miss indicates dictionary 510 is to be updated. As described earlier, the comparison result of a Partial Hit also indicates dictionary 510 is to be updated. Although the indication of at least one dictionary update may not be used for generating compressed packets, this indication can be used to determine whether dictionary 510 is to be updated. In this example, control logic determines an update of dictionary 510 occurs in addition to determining the update is entry 7 being written with the value C. Therefore, at time t5, compressed packets are generated for each of Word 0 through Word 3 while at the same time, the later second group of Word 4 through Word 7 are loaded into Lane 0 through Lane 3.

In some embodiments, the later second group of Word 4 through Word 7 are loaded into Lane 0 through Lane 3 at time t4 and the respective indexes are found by the hash function. By time t5, a read request is sent to dictionary 510 on behalf of Word 4 through Word 7 if they have the same index. In addition, the update corresponding to Word 3 may be forwarded to this read request if Word 4 through Word 7 also have the same index 7. Therefore, Lane 0 through Lane 3 uses the value C for comparisons at time t6 for Word 4 through Word 7 although the dependencies between Word 0 through Word 3 were not yet determined prior to the read request for Word 4 through Word 7.

In some embodiments, there is not an appreciable amount of time constraint for generating the compressed packets. The latency for generating the compressed packets may be hidden while multiple passes are performed on groups of compressed packets. Therefore, at time t5, control logic for determining the true dependencies between Word 0 through Word 7 may begin processing while processing has already begun on the second group of Word 4 through Word 7. For example, finding the true dependent value for the comparison operation is done. Referring briefly again to FIG. 6, the true dependent value for each of Word 2 and Word 3 is the value B and not the value A. The value B is the value of Word 1, which is the youngest of the words older than Word 2. Each of Word 0 and Word 1 is older than Word 2, and Word 1 is the youngest word of these two words. Similarly, each of Word 0, Word 1 and Word 2 is older than Word 3, and Word 2 is the youngest word of these three words. The value of Word 2 is also B and it is the true dependent value to be used for the comparison operation for Word 3.

The control logic to find the true dependent value may include comparison logic and multiplexer circuits. The latency for finding the true dependent value may be appreciable, especially as the number of hardware lanes increase. Rather than add this latency between the processing of a first group of Word 0 through Word 3 and a second group of Word 4 through Word 7, this latency can be removed and hidden in the later intra-group fixing operation and subsequent compressed packet generation. It is noted no fixing may ever occur for words loaded into Lane 0 as, in some embodiments, the word loaded into Lane 0 is always the oldest word for a particular index. Therefore, the true dependent value for the comparison operation is always the value read from dictionary 510 or the value forwarded (bypassed) from the processing of previous words.

Figure 9:
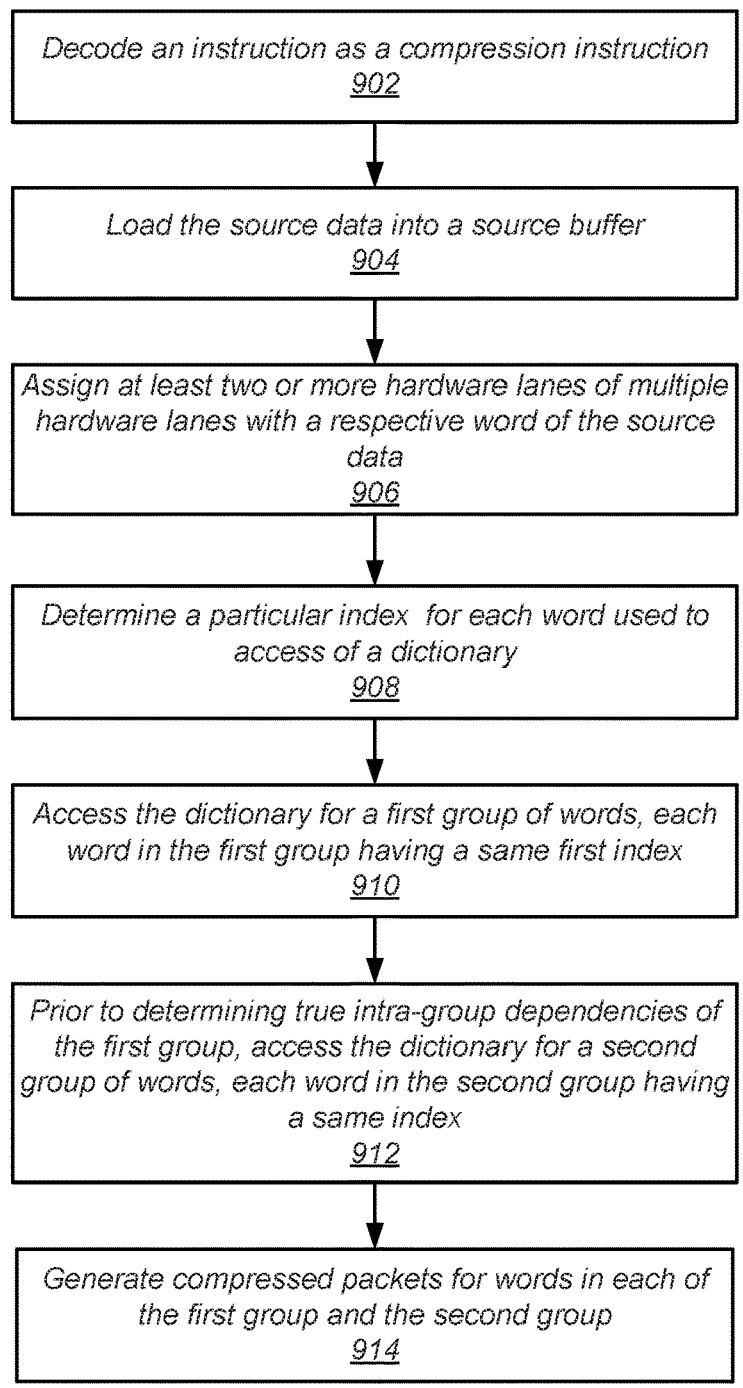
FIG. 9 is a flow diagram of one embodiment of a method for efficiently compressing data.

Referring now to FIG. 9, a generalized flow diagram of one embodiment of a method 900 for efficiently compressing data is shown. For purposes of discussion, the steps in this embodiment (as well as for FIG. 11) are shown in sequential order. However, in other embodiments some steps may occur in a different order than shown, some steps may be performed concurrently, some steps may be combined with other steps, and some steps may be absent.

In some embodiments, an instruction fetch unit receives an instruction from an instruction cache or other suitable location in system memory. The instruction is decoded and determined to be a compression instruction (block 902). In an embodiment, a compression engine of a compression/decompression unit loads (prefetches) source data, such as a source page, into a source buffer (block 904). In some embodiments, the source data is first stored in a data cache and then later stored in a read buffer in the compression/decompression unit. In an embodiment, a first number of lines are prefetched by the processor core, and the remaining lines remaining in the desired page of source data are later prefetched by a dedicated circuit included in the compression/decompression unit. The dedicated circuit may prefetch using a predetermined stride value, which may be different for compression and decompression operations.

At least two or more hardware lanes of multiple hardware lanes are assigned with a respective word of the source data (block 906). In some embodiments, the source data is partitioned into portions such as words of a fixed size. A particular index is determined for each word where the index specifies an entry of a dictionary to access (block 908). The dictionary stores the most recently seen words during compression or decompression operations. As described earlier, a particular bit field within a word is used with a hash function to generate the index. For a first group of words, each word in the first group having a same first index, the dictionary is accessed (block 910). For example, a single read request is sent to the dictionary on behalf of the multiple words in the first group with the same index.

Prior to determining true intra-group dependencies of the first group, the dictionary is accessed for a second group of words, each word in the second group having a same index (block 912). In various embodiments, each of the first group and the second group have the same index, and thus, access the same entry in the dictionary. The true intra-group dependency for a given word of the first group are the comparison results and dictionary updates for each of the words older than the given word of the first group. The comparison result and dictionary update for the given word is part of the true intra-group dependencies for words younger than the given word in the first group. The true group dependencies of the first group are used to generate compressed packets for the first group and update the dictionary correctly for a subsequent and younger second group. However, when both the youngest word is known for the first group and it is found at least one dictionary update occurs for the first group, the dictionary update needed by the second group is now known despite the true intra-group dependencies of the first group are not yet known. The dictionary update needed by the second group is the value of the youngest word of the first group being written into the entry of the dictionary pointed to by the index of the first group. In various embodiments, the value of the youngest word of the first group is forwarded (bypassed) to the second group while the dictionary update actually occurs later or at the same time.

Compressed packets (or "compression packets") are generated for words in each of the first group and the second group (block 914). In various embodiments, an intra-group fixing operation is performed for at least the first group. In an embodiment, during the processing of compression operations, an indication of at least one dictionary update is generated based on comparing each word of the first group with the copy of the word stored in the dictionary entry pointed to by the index of the first group. During the intra-group fixing (fixup) operation, the true intra-group dependencies are found by finding the true value to compare with each word of the first group. In some embodiments, the true value for a given word of the first group is the value of the youngest word older than the given word of the first group.

As described earlier, control logic for finding the true intra-group dependent value for comparing to a given word in the first group may include comparison logic and multiplexer circuits. The latency for finding the true intra-group dependent value may be appreciable, especially as the number of hardware lanes increase. Rather than add this latency between the processing of the first group and the second group, this latency can be removed and hidden in the later intra-group fixing operation. Before other examples of compression operations are provided, examples of decompression operations are next described.

Figure 10:
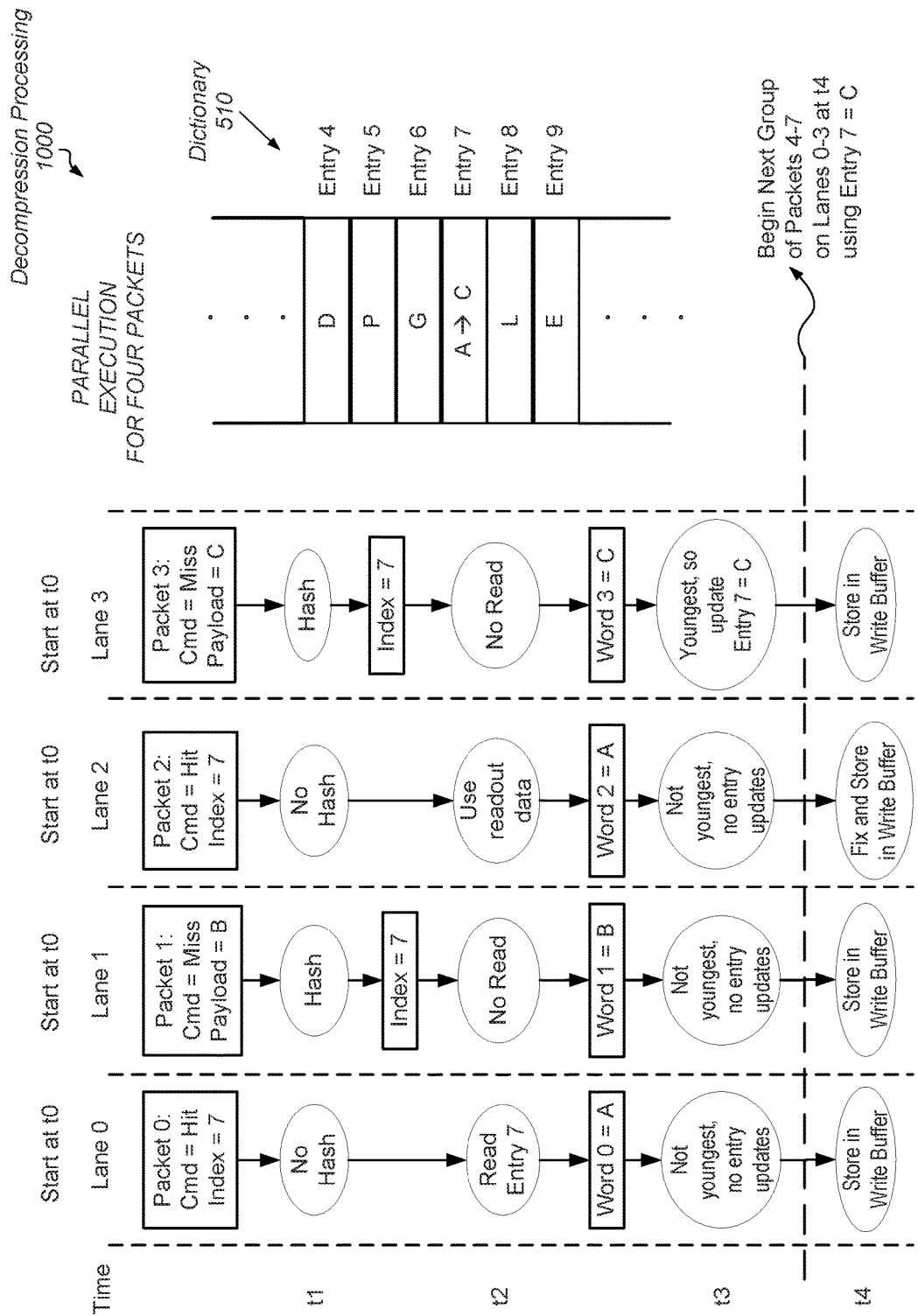
FIG. 10 is a block diagram of one embodiment of decompression processing.

Turning now to FIG. 10, a block diagram illustrating one embodiment of decompression processing 1000 is shown. In the illustrated embodiment, parallel execution is performed for a hybrid compression algorithm again. Here, the parallel hardware lanes Lane 0 through Lane 3 are used in a decompression engine. Although four hardware lanes are shown in the illustrated embodiment, another number of multiple hardware lanes is possible and contemplated. Dictionary 510, which was described earlier, is numbered identically. Similar to the hardware lanes of the compression engine, the hardware lanes of the decompression engine may use pipeline stages.

As shown, Lane 0 is assigned Packet 0 with a Cmd (command) specifying a Hit and an index of 7. Although "compressed" is not used in the name, each of Packet 0 through Packet 3 is a compressed packet generated as described earlier. Lane 1 is assigned Packet 1 with a Cmd specifying a Miss and a Payload with the value B. Lane 2 is assigned Packet 2 with a Cmd specifying a Hit and an index of 7, and Lane 3 is assigned Packet 3 with a Cmd specifying a Miss and a Payload with the value C. Entry 7 of dictionary 510 initially stores the value A. At time t1, the Packets with no index have an index generated from the respective Payloads. The index generation operations described earlier may be again used. As shown, each of Packet 1 and Packet 3 has an index of 7 generated.

In various embodiments, control logic in the decompression engine determines each hardware lane of Lane 0 through Lane 3 accesses the same entry of dictionary 510 due to having the same index of 7. In various embodiments, the control logic is implemented in hardware circuitry. Therefore, it is known Lane 0 has the oldest packet and Lane 3 has the youngest packet of Packet 0 through Packet 3. At time t2, a single read request is sent from Lane 0 to dictionary 510 on behalf of the hardware lanes Lane 0 and Lane 2. Each of Packet 1 and Packet 3 has a Payload, and accordingly, does not need to access dictionary 510 for the word corresponding to the compressed packets. As shown, each of Lane 0 and Lane 2 receives the value A from entry 7 of dictionary 510 as the decompressed word.

Referring briefly again to FIG. 6, it can be seen Word 2 has the value B. Therefore, the decompression engine has the wrong value of A for Word 2 in FIG. 10. The value B would be determined for Word 2 if true intra-group dependencies were considered at time t2. However, similar to the compression engine and to achieve relatively high throughput, the decompression engine does not determine true intra-group dependencies at this time. Allowing any packet of a later second group of packets, such as Packet 4 through Packet 7, to access dictionary 510 is dependent upon the update of dictionary 510 by the current youngest packet, which is Packet 3, rather than dependencies between any two packets of Packet 0 through Packet 3. Therefore, once the update of dictionary 510 by the current youngest packet, which is Packet 3, is known, the later second group of packets, such as Packet 4 through Packet 7, is permitted to access dictionary 510. For example, the update for the youngest packet may be forwarded (bypassed) to a read request from the later second group of packets.

In the illustrated embodiment, at time t3, it is known Packet 3 is the youngest packet of Packet 0 through Packet 3 with the same index (7), and additionally, it is known at least one update occurs for this group of packets. For example, the command (Cmd) of a Miss indicates dictionary 510 is to be updated. As described earlier, the command of a Partial Hit also indicates dictionary 510 is to be updated. Although the indication of at least one dictionary update may not be used for generating decompressed words, this indication can be used to determine whether dictionary 510 is to be updated.

In this example, control logic determines an update of dictionary 510 occurs in addition to determining the update is entry 7 being written with the value C. Therefore, at time t4, decompressed words are generated and written in a write buffer for each of Packet 0, Packet 1 and Packet 3 while at the same time, the later second group of Packet 4 through Packet 7 are loaded into Lane 0 through Lane 3. If forwarding (bypassing) is used, the second group of Packet 4 through Packet 7 is loaded into Lane 0 through Lane 3 even earlier. In some embodiments, an intra-group fixup operation occurs unconditionally for each of Packet 0 through Packet 3. In other embodiments, the oldest packet of the group, such as Packet 0, skips this operation. In addition, the commands of the packets can be used to determine whether intra-group fixup is needed for a particular packet. For example, a Miss command indicates the Payload has the correct decompressed word. In contrast, a Hit command indicates the correct decompressed word is in dictionary 510 and the data read from dictionary 510 may not be correct at this time since true intra-group dependencies are not being considered at this time t0 hide the latency for a later time.

Figure 11:
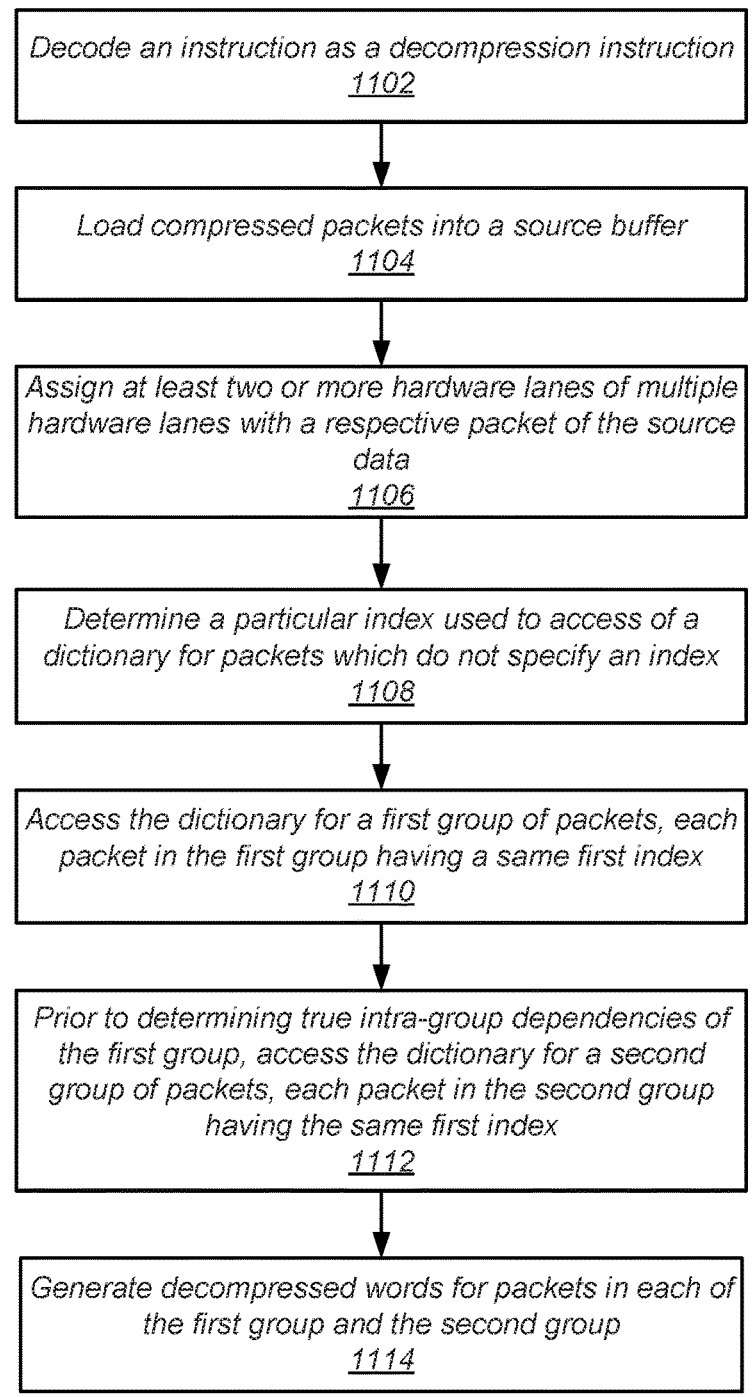
FIG. 11 is a flow diagram of one embodiment of a method for efficiently decompressing data.

Referring now to FIG. 11, a generalized flow diagram of one embodiment of a method 1100 for efficiently compressing data is shown. In some embodiments, an instruction fetch unit receives an instruction from an instruction cache or other suitable location in system memory. The instruction is decoded and determined to be a decompression instruction (block 1102). In an embodiment, a decompression engine of a compression/decompression unit loads (prefetches) source data, such as a source page of compressed packets, into a source buffer (block 1104). In some embodiments, the source data is first stored in a data cache and then later stored in a read buffer in the compression/decompression unit. Similar for the compression engine, a variety of methods can be used to prefetch data into the source buffer.

At least two or more hardware lanes of multiple hardware lanes are assigned with a respective compressed packet of the source data (block 1106). For compressed packets that do not specify an index for accessing the dictionary, a particular index is determined (block 1108). The dictionary stores the most recently seen packets during compression or decompression operations. As described earlier, a particular bit field within a packet is used with a hash function to generate the index. For a first group of packets, each packet in the first group having a same first index, the dictionary is accessed (block 1110). For example, a single read request is sent to the dictionary on behalf of multiple packets in the first group with the same index and do not include a payload with a decompressed word.

Prior to determining true intra-group dependencies of the first group, the dictionary is accessed for a second group of packets, each packet in the second group having a same index (block 1112). In various embodiments, each of the first group and the second group have the same index, and thus, access the same entry in the dictionary. The true intra-group dependency for a given packet of the first group are the comparison results provided as commands in the packets and dictionary updates for each of the packets older than the given packet of the first group. The comparison result and dictionary update for the given packet is part of the true intra-group dependencies for packets younger than the given packet in the first group. The true group dependencies of the first group are used to generate decompressed words for the first group and update the dictionary correctly for a subsequent and younger second group. However, when both the youngest packet is known for the first group and it is found at least one dictionary update occurred for the first group during compression, the dictionary update needed by the second group is now known despite the true intra-group dependencies of the first group are not yet known. The dictionary update needed by the second group is the value of the decompressed word for the youngest packet of the first group being written into the entry of the dictionary pointed to by the index of the first group. In various embodiments, the value of the youngest packet of the first group is forwarded (bypassed) to the second group while the dictionary update actually occurs later or at the same time.

Decompressed words are generated for packets in each of the first group and the second group (block 1114). In various embodiments, an intra-group fixing operation is performed for at least the first group. Similar to the intra-group fixing (fixup) operation for the compression engine, the intra-group fixing (fixup) operation for the decompression engine determines the true intra-group dependencies by finding the true source of the decompressed word for each packet of the first group. In some embodiments, the true value for a given packet of the first group is the value of the youngest packet older than the given packet of the first group.

As described earlier, control logic for finding the true intra-group dependent value for comparing to a given packet in the first group may include comparison logic and multiplexer circuits. The latency for finding the true intra-group dependent value may be appreciable, especially as the number of hardware lanes increase. Rather than add this latency between the processing of the first group and the second group, this latency can be removed and hidden in the later intra-group fixing operation.

Figure 12:
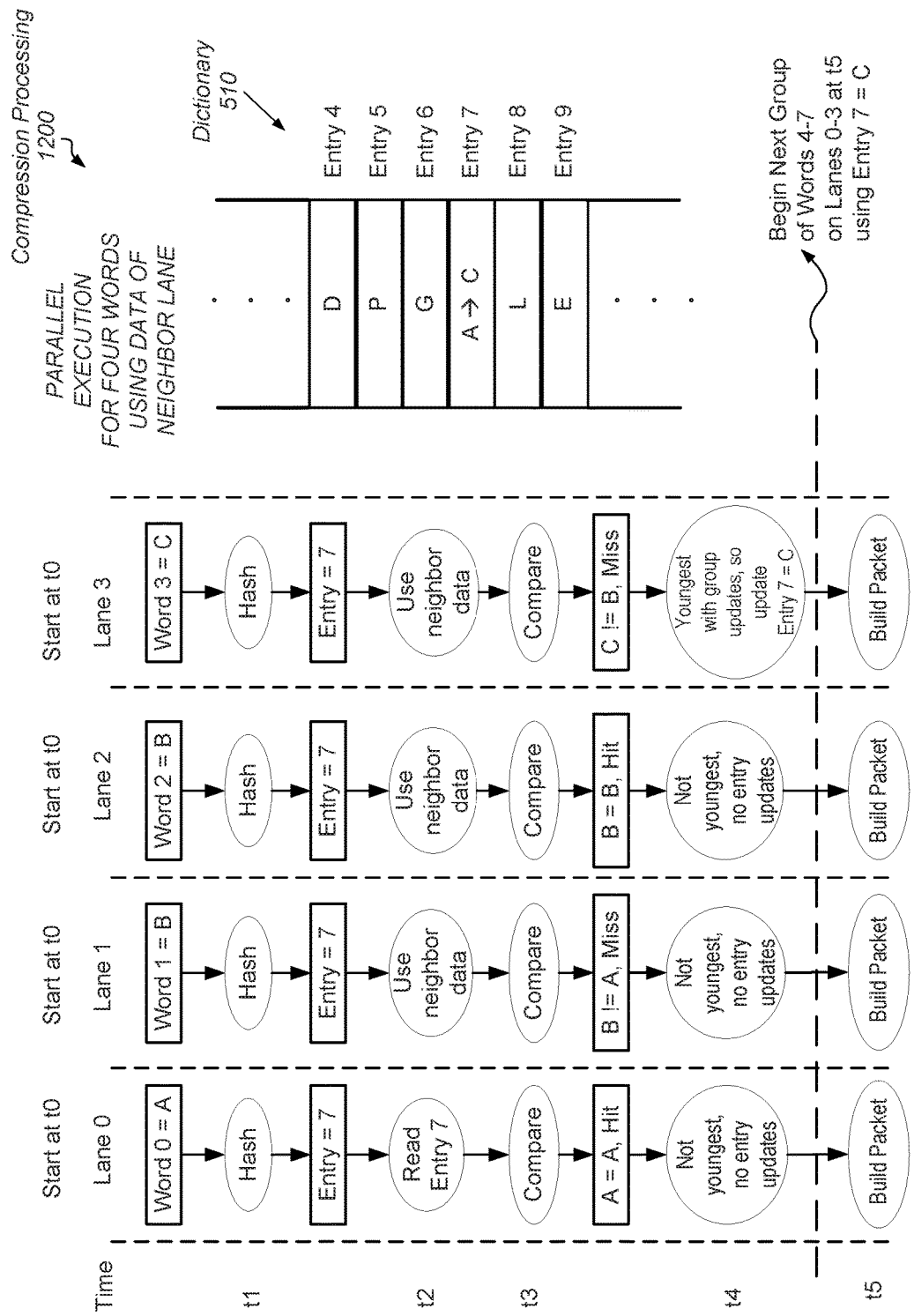
FIG. 12 is a block diagram of another embodiment of compression processing.

Referring now to FIG. 12, a block diagram illustrating one embodiment of compression processing 1200 is shown. In the illustrated embodiment, parallel execution is performed for a hybrid compression algorithm again using the hardware lanes Lane 0 through Lane 3 and dictionary 510. As shown, at time t0, each of Lane 0 through Lane 3 is loaded with a respective one of Word 0 through Word 3. The values of Word 0 through Word 3 are the same as the values used in the illustrated embodiment of FIG. 8. The operations performed at times t1 through t5 for a given hardware lane of Lane 0 through Lane 3 are the same as described earlier with some adjustments.

In this illustrated embodiment, at time t2, Lane 1 through Lane 3 determines the true intra-group dependency value to use for comparing against the value of the word assigned to the lane. As described earlier, in some embodiments, only words with a same index progress in the pipeline together. In addition, it was described earlier that the true intra-group dependent value for a given word is the youngest of the words older than the given word. Therefore, due to the assigning of the words to the lanes and only allowing words with a same index to progress together in the pipeline, the true dependent value is the word in the adjacent lane. It is known beforehand, the true dependent value for Word 0 in Lane 0 is the word read from dictionary 510, and the true dependent value for Word 1 in Lane 1 is Word 0 in Lane 0, and the true dependent value for Word 2 in Lane 2 is Word 1 in Lane 1, and the true dependent value for Word 3 in Lane 3 is Word 2 in Lane 2. No multiplexing circuits and comparators are used. Rather, direct wire routes can be used. Accordingly, no intra-group fixup operations are needed prior to generating compressed packets.

Figure 13:
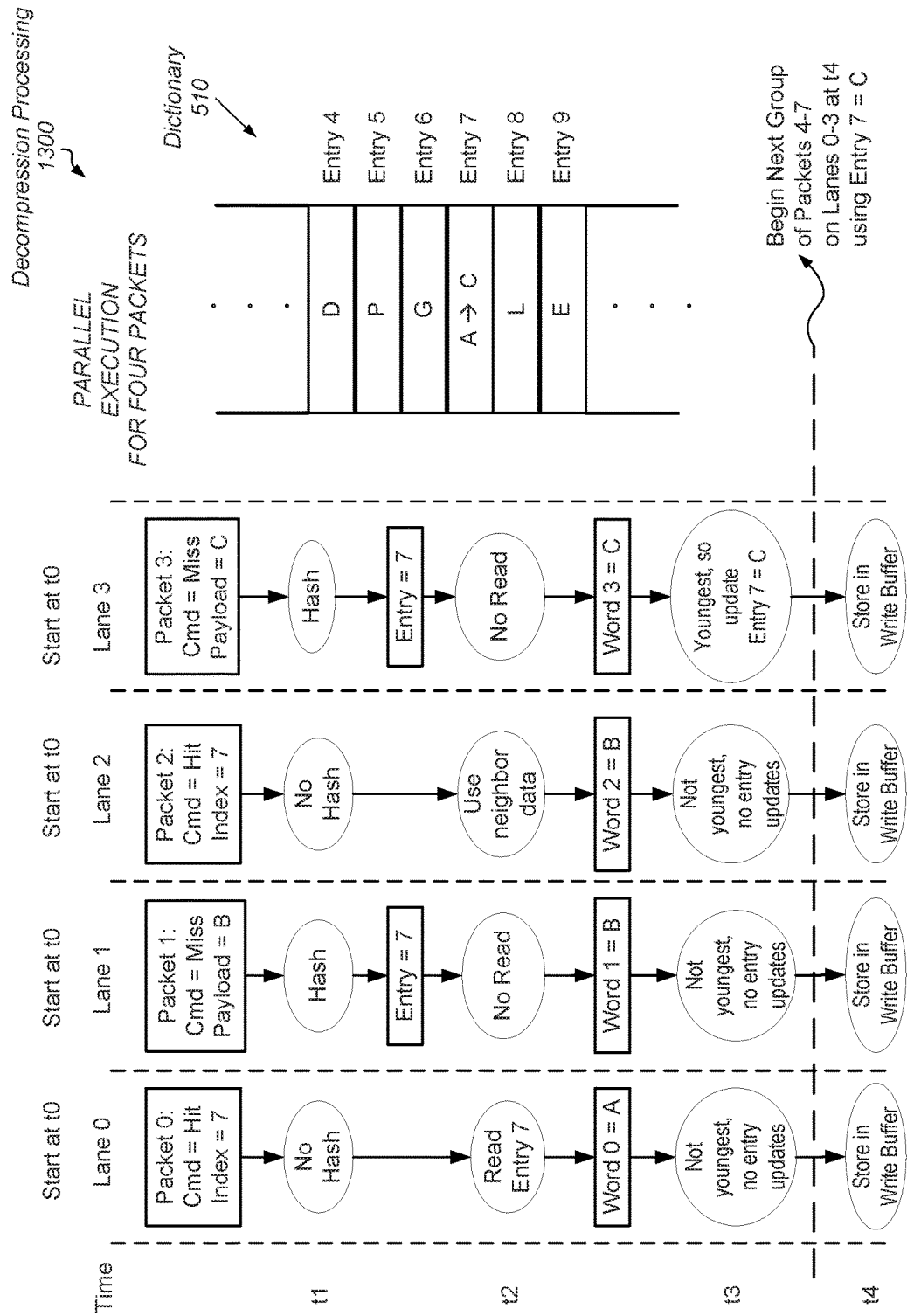
FIG. 13 is a block diagram of another embodiment of decompression processing.

Turning now to FIG. 13, a block diagram illustrating one embodiment of decompression processing 1300 is shown. In the illustrated embodiment, parallel execution is performed for a hybrid decompression algorithm again using the hardware lanes Lane 0 through Lane 3 and dictionary 510. As shown, at time t0, each of Lane 0 through Lane 3 is loaded with a respective one of Packet 0 through Packet 3. The values of Packet 0 through Packet 3 are the same as the values used in the illustrated embodiment of FIG. 10. The operations performed at times t1 through t4 for a given hardware lane of Lane 0 through Lane 3 are the same as described earlier with some adjustments.

In the illustrated embodiment, at time t2, Lane 1 through Lane 3 determines the true intra-group dependency value to use for generating its decompressed word. As described earlier, in some embodiments, only packets with a same index progress in the pipeline together. In addition, it was described earlier that the true intra-group dependent value for a given packet is the youngest of the packets older than the given packet. Therefore, due to the assigning of the packets to the lanes and only allowing packets with a same index to progress together in the pipeline, after time t1 when the index is known for each of the assigned packets, the command (Cmd) of the packet is used to select between the Payload (Cmd=Miss) and the decompressed word from the adjacent lane (Cmd=Hit). It is known between time t1 and t2, the true decompressed word for Packet 0 in Lane 0 is the packet read from dictionary 510, and the true decompressed word for Packet 1 in Lane 1 is the Payload of Lane 1, and the true decompressed word for Packet 2 in Lane 2 is the Payload of Lane 3. Some multiplexing circuits are used and comparators for the Cmd value. However, the latency may still be appreciably small, and accordingly, no intra-group fixup operations are needed prior to storing decompressed words in the write buffer.

Referring now to FIG. 14, a block diagram illustrating one embodiment of compression processing 1400 is shown. In the illustrated embodiment, parallel execution is performed for a hybrid compression algorithm again using the hardware lanes Lane 0 through Lane 3 and dictionary 510. As shown, at time t0, each of Lane 0 through Lane 3 is loaded with a respective one of Word 0 through Word 3. The values of Word 0 through Word 3 are the same as the values used in the illustrated embodiment of FIG. 8 and FIG. 12. The operations performed at times t1 through t5 for a given hardware lane of Lane 0 through Lane 3 are the same as described earlier except performed in a different order.

As described earlier, it can be known ahead of time that Lane 0 has the oldest word of Word 0 through Word 3 and Lane 3 has the youngest word of Word 0 through Word 3. At time t2, a single read request is sent from Lane 0 to dictionary 510. In addition, at time t2, the value of the youngest word, which is Word 3, is stored for a later update of dictionary 510. For example, the value C of Word 3 can be stored in a register to be used for writing entry 7 of dictionary 510 and for forwarding (bypassing) the value C to a younger second group with Word 4 through Word 7. At time t4, the determination for finding the true intra-group dependent value begins. In some embodiments, the processing steps at time t4 lasts for two or more pipeline stages. The comparisons are done at time t5 and the compressed packets are generated without performing intra-group fixup operations.

In various embodiments, program instructions of a software application may be used to implement the methods and/or mechanisms previously described. The program instructions may describe the behavior of hardware in a high-level programming language, such as C. Alternatively, a hardware design language (HDL) may be used, such as Verilog. The program instructions may be stored on a non-transitory computer readable storage medium. Numerous types of storage media are available. The storage medium may be accessible by a computer during use to provide the program instructions and accompanying data to the computer for program execution. In some embodiments, a synthesis tool reads the program instructions in order to produce a netlist comprising a list of gates from a synthesis library.

It should be emphasized that the above-described embodiments are only non-limiting examples of implementations. Numerous variations and modifications will become apparent to those skilled in the art once the above disclosure is fully appreciated. It is intended that the following claims be interpreted to embrace all such variations and modifications.

What is claimed is:

1. An apparatus comprising:
a first buffer configured to store a plurality of input words;
a table comprising a plurality of entries; and
compression circuitry comprising a first plurality of hardware lanes, wherein in response to receiving an indication of a compression instruction, the compression circuitry is configured to:
assign a first group of two or more input words from the plurality of input words to the first plurality of hardware lanes;
determine at least two of the first group of two or more input words correspond to a same entry of the table;
prior to determining dependencies between input words of the first group:
determine whether to update the table with any of the input words of the first group; and assign a second group of input words from the plurality of input words to the first plurality of hardware lanes, wherein the second group is different from the first group;

generate a compression packet that stores data corresponding to the plurality of input words.

2. The apparatus as recited in claim 1, wherein the compression circuitry is further configured to:

determine dependencies between input words of the first group; and for each hardware lane of the plurality of hardware lanes, generate a command specifying a type of compressed packet based on the dependencies between input words of the first group.

3. The apparatus as recited in claim 1, wherein for each table entry to be accessed, the compression circuitry is further configured to:

determine a youngest input word of the first group; and forward the youngest word to the second group prior to determining dependencies between input words of the first group.

4. The apparatus as recited in claim 1, wherein for each table entry to be accessed, the compression circuitry is further configured to:

determine an oldest input word of the first group; and send a read request for an input word in the table from only a hardware lane of the plurality of hardware lanes assigned to the oldest input word.

5. The apparatus as recited in claim 4, wherein for each hardware lane of the plurality of hardware lanes, determining dependencies between input words of the first group comprises comparing an input word assigned to the hardware lane with a second input word.

6. The apparatus as recited in claim 5, wherein the second input word is an input word stored in an entry of the table determined for the input word assigned to the hardware lane.

7. The apparatus as recited in claim 5, wherein the second input word is:

for the hardware lane assigned to the oldest input word of the first group, an input word stored in an entry of the table determined for each input word of the first group; and for given hardware lanes not assigned to the oldest input word of the first group, an input word of the first group that is the youngest input word older than an input word assigned to the given hardware lane.

8. The apparatus as recited in claim 3, wherein the compression circuitry is further configured to store the youngest input word of the first group in the table, in response to determining a generated command specifying a type of compressed packet indicates an update for the table.

9. The apparatus as recited in claim 3, wherein the compression circuitry is further configured to store the youngest input word of the first group in the table prior to determining a generated command specifying a type of compressed packet indicates an update for the table.

10. The apparatus as recited in claim 1, further comprising decompression circuitry comprising a second plurality of hardware lanes, wherein in response to receiving an indication of a decompression instruction, the decompression circuitry is configured to:

assign a third group of two or more compressed packets from a plurality of compressed packets to the second plurality of hardware lanes, wherein each compressed packet of the third group is indicated as accessing a same entry of the table;

for each hardware lane of the second plurality of hardware lanes, determine whether a source for providing a word for an assigned compressed packet is the table or the assigned compressed packet; and write the word from the determined source in a write buffer.

11. The apparatus as recited in claim 10, wherein the decompression circuitry is further configured to:

determine a youngest compressed packet of the third group;

for a hardware lane of the second plurality of hardware lanes assigned to the youngest compressed packet, store the word for the hardware lane in the table.

12. A method comprising:

storing a plurality of input words in a first buffer;

in response to receiving an indication of a compression instruction:

assigning a first group of two or more input words from the plurality of input words to a first plurality of hardware lanes;

determining at least two of the first group of two or more input words correspond to a same entry of a table comprising a plurality of entries;

prior to determining dependencies between input words of the first group:

determining whether to update the table with any of the input words of the first group; and assigning a second group of input words from the plurality of input words to the first plurality of hardware lanes, wherein the second group is different from the first group;

generating a compression packet that stores data corresponding to the plurality of input words.

13. The method as recited in claim 12, wherein each of the two or more assigned input words has a corresponding index pointing to a same entry of a plurality of entries in the table.

14. The method as recited in claim 12, wherein for each entry in the table to be accessed, the method further comprises:

determining an oldest input word of the first group; and sending a read request for an input word in the table from only a hardware lane of the plurality of hardware lanes assigned to the oldest input word.

15. The method as recited in claim 14, wherein the second input word for each hardware lane of the two or more hardware lanes is the input word read from the table.

16. The method as recited in claim 12, wherein in response to receiving an indication of a decompression instruction, the method further comprises:

selecting two or more compressed packets of a plurality of compressed packets stored for decompression;

assigning two or more hardware lanes of a second plurality of hardware lanes to the selected two or more compressed packets;

for each hardware lane of the two or more hardware lanes of the second plurality of hardware lanes, determining whether a source for providing a word for the compressed packet is the table or the compressed packet; and writing the word from the determined source in a write buffer.

17. A system comprising:

a memory;

a cache memory; and a processor configured to:

fetch a plurality of input words into the cache memory;
assign a first group of two or more input words from the plurality of input words to a first plurality of hardware lanes;
determine at least two of the first group of two or more input words correspond to a same entry of a plurality of entries in a table;
prior to determining dependencies between input words of the first group:
  determine whether to update the table with any of the input words of the first group; and
  assign a second group of input words from the plurality of input words to the first plurality of hardware lanes, wherein the second group is different from the first group;
generate a compression packet that stores data corresponding to the plurality of input words.

18. The system as recited in claim 17, wherein each of the two or more assigned input words has a corresponding index pointing to a same entry of a plurality of entries in the table.

19. The system as recited in claim 17, wherein for each entry of the table to be accessed, the processor is further configured to:
  determine an oldest input word of the first group; and
  send a read request for an input word in the table from only a hardware lane of the plurality of hardware lanes assigned to the oldest input word.

20. The system as recited in claim 17, wherein in response to receiving an indication of a decompression instruction, the processor is configured to:
  select two or more packets of a plurality of packets;
  assign two or more hardware lanes of a second plurality of hardware lanes to the selected two or more packets;
  for each hardware lane of the two or more hardware lanes of the second plurality of hardware lanes, determine whether a source for providing a word for the compressed packet is the table or the compressed packet; and
  write the word from the determined source in a write buffer.

* * * * *